(12) United States Patent
Wang et al.

(10) Patent No.: US 12,341,013 B2
(45) Date of Patent: Jun. 24, 2025

(54) METHOD AND STRUCTURE FOR BARRIER-LESS PLUG

(71) Applicant: Taiwan Semiconductor Manufacturing Co., Ltd., Hsinchu (TW)

(72) Inventors: Sung-Li Wang, Hsinchu County (TW); Hung-Yi Huang, Hsin-chu (TW); Yu-Yun Peng, Hsinchu (TW); Mrunal A. Khaderbad, Hsinchu (TW); Chia-Hung Chu, Taipei (TW); Shuen-Shin Liang, Hsinchu County (TW); Keng-Chu Lin, Ping-Tung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/756,008

(22) Filed: Jun. 27, 2024

(65) Prior Publication Data
US 2024/0347342 A1 Oct. 17, 2024

Related U.S. Application Data

(62) Division of application No. 17/509,314, filed on Oct. 25, 2021, now Pat. No. 12,051,592, which is a (Continued)

(51) Int. Cl.
*H01L 21/768* (2006.01)
*H01L 21/265* (2006.01)
(Continued)

(52) U.S. Cl.
CPC .. *H01L 21/26586* (2013.01); *H01L 21/76804* (2013.01); *H01L 21/76805* (2013.01);
(Continued)

(58) Field of Classification Search
None
See application file for complete search history.

(56) References Cited

U.S. PATENT DOCUMENTS 5,843,843 A * 12/1998 Lee .................. H01L 21/76856
257/E21.585
6,034,392 A 3/2000 Joo
(Continued)

FOREIGN PATENT DOCUMENTS

CN 104813446 A 7/2015

*Primary Examiner* — Scott B Geyer
(74) *Attorney, Agent, or Firm* — HAYNES AND BOONE, LLP

(57) ABSTRACT

A method includes receiving a structure having a dielectric layer over a conductive feature, wherein the conductive feature includes a second metal. The method further includes etching a hole through the dielectric layer and exposing the conductive feature and depositing a first metal into the hole and in direct contact with the dielectric layer and the conductive feature, wherein the first metal entirely fills the hole. The method further includes annealing the structure such that atoms of the second metal are diffused into grain boundaries of the first metal and into interfaces between the first metal and the dielectric layer. After the annealing, the method further includes performing a chemical mechanical planarization (CMP) process to remove at least a portion of the first metal.

20 Claims, 21 Drawing Sheets

Related U.S. Application Data division of application No. 16/589,941, filed on Oct. 1, 2019, now Pat. No. 11,158,539.

(51) Int. Cl.
*H01L 23/532* (2006.01)
*H01L 23/535* (2006.01)
*H10D 64/23* (2025.01)

(52) U.S. Cl.
CPC .... *H01L 21/7684* (2013.01); *H01L 21/76862* (2013.01); *H01L 21/76864* (2013.01); *H01L 21/76877* (2013.01); *H01L 21/76883* (2013.01); *H01L 21/76895* (2013.01); *H01L 23/53209* (2013.01); *H01L 23/53242* (2013.01); *H01L 23/53257* (2013.01); *H01L 23/535* (2013.01); *H10D 64/256* (2025.01); *H01L 2221/1068* (2013.01)

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai | |
| 8,816,444 B2 | 8/2014 | Wann | |
| 8,823,065 B2 | 9/2014 | Wang | |
| 8,860,148 B2 | 10/2014 | Hu | |
| 9,105,490 B2 | 8/2015 | Wang | |
| 9,236,267 B2 | 1/2016 | De | |
| 9,236,300 B2 | 1/2016 | Liaw | |
| 9,520,482 B1 | 12/2016 | Chang | |
| 9,576,814 B2 | 2/2017 | Wu | |
| 9,613,855 B1 | 4/2017 | Patil | |
| 2002/0168812 A1 | 11/2002 | Oda | |
| 2003/0129832 A1* | 7/2003 | Fujikawa | H01L 21/76886 257/E21.591 |
| 2005/0048767 A1 | 3/2005 | Matsumoto | |
| 2005/0161817 A1* | 7/2005 | Meyer | H01L 21/76838 257/E21.582 |
| 2006/0113685 A1* | 6/2006 | Ueki | H01L 21/76883 257/785 |
| 2008/0237860 A1 | 10/2008 | Ishizaka | |
| 2009/0130843 A1 | 5/2009 | Suzuki | |
| 2009/0206484 A1* | 8/2009 | Baker-O'Neal | H01L 21/76877 438/653 |
| 2009/0273085 A1* | 11/2009 | Jourdan | H01L 23/53295 257/E21.584 |
| 2010/0041230 A1* | 2/2010 | Witt | H01L 21/76886 257/E21.705 |
| 2010/0327447 A1* | 12/2010 | Iguchi | H01L 23/53233 438/653 |
| 2011/0266676 A1 | 11/2011 | Isobayashi | |
| 2012/0074571 A1 | 3/2012 | Lavoie | |
| 2012/0153483 A1 | 6/2012 | Akolkar | |
| 2012/0168949 A1 | 7/2012 | Maekawa | |
| 2013/0127058 A1 | 5/2013 | Lavoie | |
| 2014/0361436 A1* | 12/2014 | Matsumoto | H01L 23/53238 257/762 |
| 2015/0311150 A1 | 10/2015 | Lin | |
| 2017/0148738 A1* | 5/2017 | Edelstein | H01L 23/53238 |
| 2017/0365550 A1* | 12/2017 | Clevenger | H01L 21/76814 |
| 2018/0005939 A1* | 1/2018 | Hu | H01L 21/76802 |
| 2018/0090372 A1* | 3/2018 | Briggs | H01L 21/76816 |
| 2018/0108610 A1* | 4/2018 | Yang | H01L 21/7684 |
| 2019/0013240 A1 | 1/2019 | Licausi | |
| 2019/0067198 A1 | 2/2019 | Bruley | |
| 2019/0164885 A1 | 5/2019 | Yang | |
| 2019/0214296 A1 | 7/2019 | Wang | |
| 2019/0326168 A1* | 10/2019 | Yang | H01L 21/76879 |
| 2020/0013673 A1* | 1/2020 | Zierath | H01L 21/76858 |
| 2020/0135548 A1* | 4/2020 | Wei | H01L 21/3115 |
| 2021/0082752 A1 | 3/2021 | Lee | |

\* cited by examiner

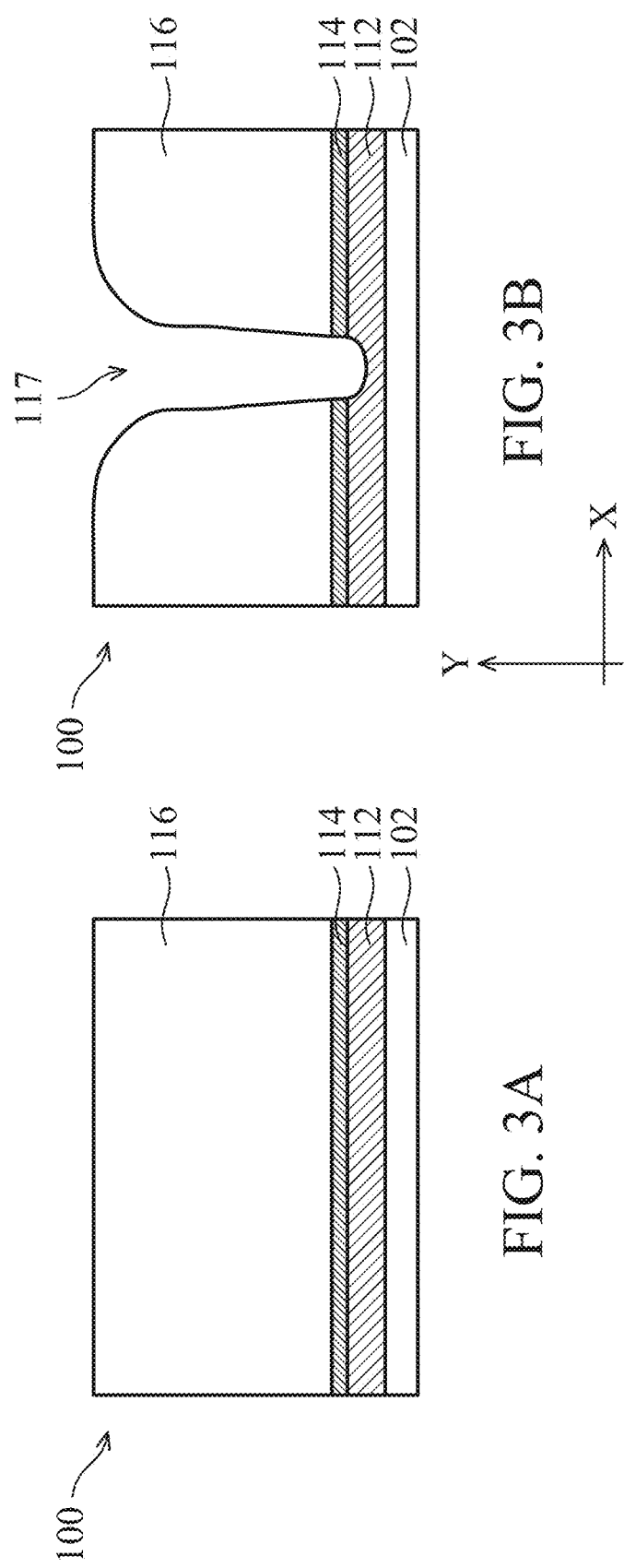

METHOD AND STRUCTURE FOR BARRIER-LESS PLUG

PRIORITY

This is a divisional application of U.S. application Ser. No. 17/509,314, filed Oct. 25, 2021, which is a divisional application of U.S. application Ser. No. 16/589,941, filed Oct. 1, 2019, each of which is incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, via plugs having a bulk metal (such as tungsten (W)) with a barrier layer or a seed layer (such as titanium, titanium nitride, and tantalum nitride) have been traditionally used as via plugs in IC interconnect. As the down-scaling continues, via plugs also become smaller and smaller, and traditional via plugs exhibit increased resistance and become unsuitable in some instances. Improvements in these areas are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 3B, 3C, 3D, 3E, and 3F illustrate cross-sectional views of a semiconductor structure during various fabrication steps according to the method of FIG. 2, in accordance with some embodiments.

DETAILED DESCRIPTION

Figure 1A:
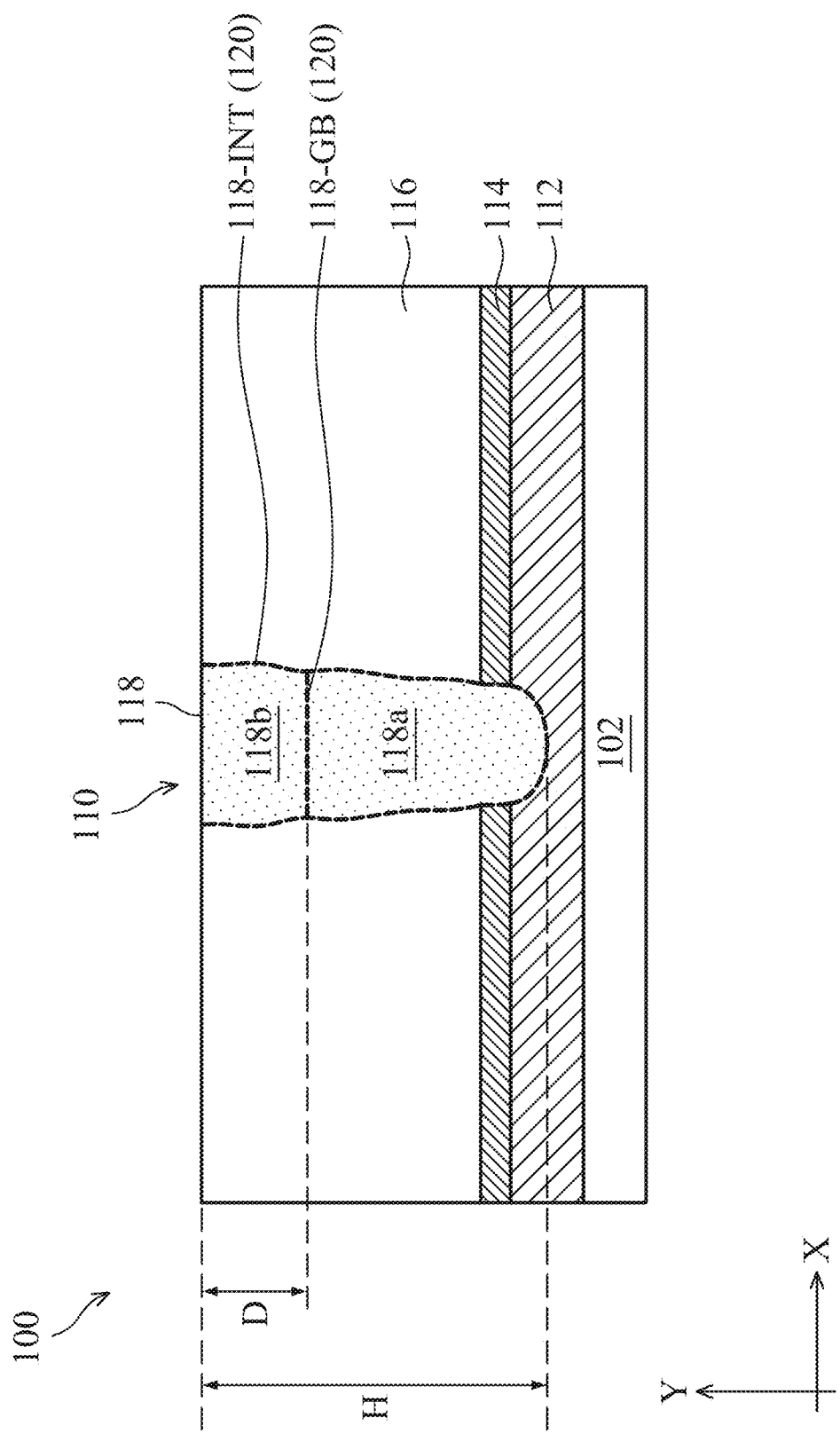
FIG. 1A shows a cross-sectional view of a semiconductor structure constructed according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices and fabrication methods, and more particularly to plugs for interconnecting conductive features between different layers of an integrated circuit (IC). A plug is sometimes referred to as a via, a via plug, or a contact plug. Traditional plugs have a barrier layer or a seed layer surrounding a bulk metal layer. The barrier layer protects the bulk metal layer from surrounding structures such as interlayer dielectric layer(s). As the ICs continue to scale down, plugs also scale down and the volume of the bulk metal in plugs becomes smaller. Consequently, the resistance of the traditional plugs increases. As the critical dimension of the plugs shrinks to 10 nm or below, a new plug structure is desired. An object of the present disclosure is to provide barrier-less plugs that have lower electrical resistance than traditional plugs. The barrier-less plug, as its name suggests, has no barrier layer or seed layer between metal layer(s) of the plug and those structures surrounding the metal layer(s) of the plug. Thus, the barrier-less plug provides more volume for metal than traditional plugs for the same via hole, thereby providing lower resistance than traditional plugs. To stabilize the interface between the barrier-less plug and the surrounding structures, the barrier-less plug of the present disclosure includes two metals. A first metal is deposited to fill a via hole, and a second metal is introduced into grain boundaries between multiple grains of the first metal and/or into the interface between the first metal and those surrounding structures. The second metal functions to stabilize (or pin) the grains of the first metal and to increase thermal stability of the barrier-less plug for subsequent processes. Without the second metal, the barrier-less plug might deform (such as pitting or grooving) during subsequent thermal processes, which would cause quality and reliability issues for the IC.

FIG. 1A illustrates a cross-sectional view of a semiconductor device (or semiconductor structure) 100, constructed according to aspects of the present disclosure. Referring to FIG. 1A, the device 100 includes a substrate 102 which may include a silicon substrate (e.g., a silicon wafer) or another semiconductor, such as germanium; a compound semiconductor including silicon carbide, gallium nitride, gallium arsenide, gallium phosphide, indium phosphide, indium arsenide, and indium antimonide; an alloy semiconductor including silicon germanium, gallium arsenide phosphide, aluminum indium phosphide, aluminum gallium arsenide, gallium indium arsenide, gallium indium phosphide, and gallium indium arsenide phosphide; or combinations thereof. In embodiments, the substrate 102 may include indium tin oxide (ITO) glass, include silicon on insulator (SOI) substrate, be strained and/or stressed for performance enhancement, include epitaxial regions, doped regions, and/or include other suitable features and layers. Particularly, the substrate 102 may include active regions (such as fin active regions) and isolation structures as well as various active and passive devices, such as p-type field effect transistors (PFETs), n-type FETs (NFETs), multi-gate FETs such as FinFETs and gate-all-around (GAA) FETs, metal-oxide semiconductor field effect transistors (MOSFETs), complementary metal-oxide semiconductor (CMOS) transistors, bipolar transistors, high voltage transistors, high frequency transistors, static random access memory (SRAM) cells, other memory cells, resistors, capacitors, and inductors.

Still referring to FIG. 1A, the semiconductor structure 100 further includes a conductive feature 112 over the substrate 102. In some embodiments, the conductive feature 112 may be part of an electrode of a transistor, such as a source electrode, a drain electrode, or a gate electrode. A source (or drain) electrode may include n-type doped silicon for NFETs, p-type doped silicon germanium for PFETs, or other suitable materials. A source (or drain) electrode may also include silicide such as nickel silicide, titanium silicide, cobalt silicide, or other suitable silicidation or germanosilicidation. A gate electrode may include aluminum, tungsten, cobalt, and/or other suitable materials. In some embodiments, the conductive feature 112 may be part of a contact feature such as a source contact, a drain contact, or a gate contact, and may include cobalt, tungsten, ruthenium, rhodium, iridium, molybdenum, other metals, a metal nitride such as titanium nitride or tantalum nitride, or a combination thereof. In some embodiments, the conductive feature 112 may be part of an interconnect structure, such as a metal wire or a metal plug, and may include copper, cobalt, tungsten, ruthenium, rhodium, iridium, molybdenum, other metals, a metal nitride such as titanium nitride or tantalum nitride, or a combination thereof.

In the present embodiment, the semiconductor structure 100 further includes an etch stop layer 114 over the conductive feature 112. The etch stop layer 114 may include silicon nitride, alumina, silicon carbide, silicon oxycarbide, or other suitable material. The etch stop layer 114 may be formed by chemical vapor deposition (CVD), physical vapor deposition (PVD), atomic layer deposition (ALD), or other suitable deposition techniques. The etch stop layer 114 is optional and may be omitted in some embodiments.

Still referring to FIG. 1A, the semiconductor structure 100 further includes a dielectric layer 116 over the etch stop layer 114. The dielectric layer 116 may include a dielectric material (e.g., a semiconductor oxide such as silicon dioxide, a semiconductor nitride, a semiconductor oxynitride, a semiconductor carbide, etc.), a low-k dielectric material, tetracthoxysilane (TEOS), spin on glass (SOG), borophosphilicate glass (BPSG), fluorosilicate glass (FSG), phosphosilicate glass (PSG), Xerogel, Acrogel, amorphous fluorinated carbon, parylene, and/or other suitable dielectric materials. The dielectric layer 116 may be formed by plasma enhanced CVD (PECVD), flowable CVD (FCVD), or other suitable methods.

Still referring to FIG. 1A, the semiconductor structure 100 further includes a barrier-less plug 110. On its bottom and sidewalls, the plug 110 is surrounded by and in direct contact with the conductive feature 112, the etch stop layer 114, and the dielectric layer 116. In the present embodiment, the plug 110 includes a first metal 118 and a second metal 120. The first metal 118 includes one or more grains, with two grains 118a and 118b shown in this example. The boundary between the grains of the first metal 118 is indicated with a dashed line 118-GB. In some embodiment, the depth "D" of the grain boundary 118-GB from the top surface of the plug 110 is equal to or less than 60% of the height "H" of the plug 110, both measured along the "Y" direction. For example, a ratio of D to H may range from 20% to 50% in some embodiments. The interface between the first metal 118 and the surrounding structures 112, 114, and 116 is indicated with a dashed line 118-INT. In the present embodiment, the second metal 120 is distributed along the grain boundary 118-GB and the interface 118-INT. In some embodiments, the plug 110 has only one grain of the first metal 118, such as the grain 118a; and the second metal 120 is distributed along the interface 118-INT. Though not illustrated in FIG. 1A, the second metal 120 may also be distributed inside the grain(s) of the first metal 118. In some embodiment, the ratio of the second metal 120 to the first metal 118 is higher along the grain boundary 118-GB and the interface 118-INT than inside the first metal 118. For example, this ratio may be 10% to 90% along the grain boundary 118-GB and the interface 118-INT and may be 5% to 40% inside the grains of the first metal 118. The second metal 120 functions to stabilize the grain boundary 118-GB as well as the interface 118-INT during thermal processing. Without the second metal 120, the first metal 118 may deform along the grain boundary 118-GB and/or the interface 118-INT, causing quality and reliability issues.

In some embodiment, the second metal 120 has a lower melting point than the first metal 118 such that the second metal 120 can flow and diffuse along the grain boundary 118-GB and the interface 118-INT during an annealing process. To further this embodiment, the second metal 120 may be introduced into the plug 110 by depositing the second metal 120 over or under the first metal 118 and subsequently performing an annealing process. In one example, the first metal 118 includes ruthenium and the second metal 120 includes cobalt, nickel, or rhodium. In another example, the first metal 118 includes one of ruthenium, iridium, molybdenum, and tungsten; and the second metal 120 includes a metal different from the first metal and has a lower melting point, such as cobalt, nickel, or rhodium.

In some embodiment, the second metal 120 may have a lower or a higher melting point than the first metal 118. To further this embodiment, the second metal 120 may be introduced into the plug 110 by implanting ions of the second metal 120 into the first metal 118 and subsequently performing an annealing process so that the implanted species may diffuse along the grain boundary 118-GB and the interface 118-INT. In one example of this embodiment, the first metal 118 includes ruthenium and the second metal 120 includes one of cobalt, nickel, rhodium, iridium, molybdenum, and tungsten. Other materials of the first and the second metals are also possible.

Figure 1B:
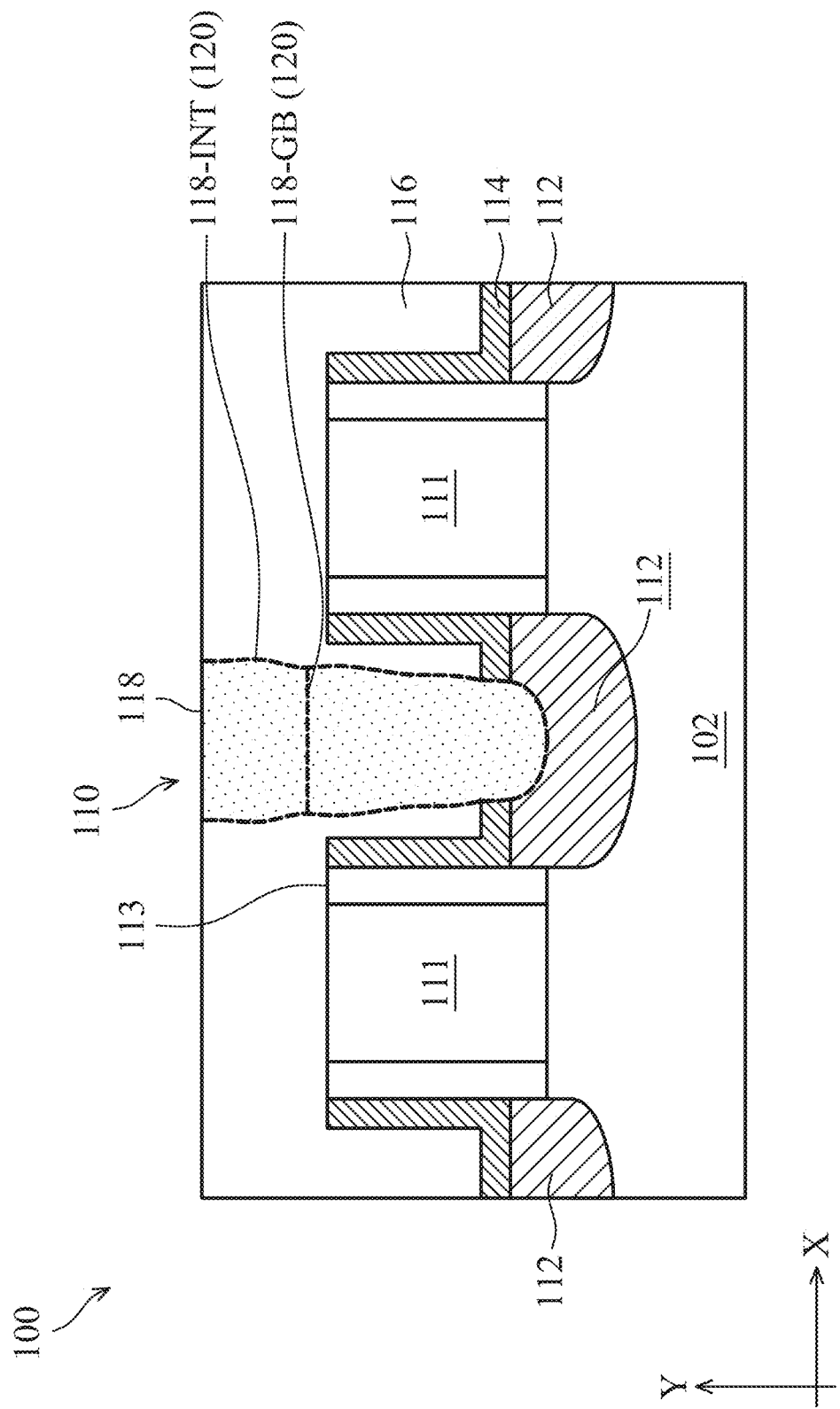
FIGS. 1B, 1C, and 1D show examples of the semiconductor structure of FIG. 1A.

FIG. 1B illustrates an example of the structure 100 where the plug 110 is disposed over a source/drain. In other words, the plug 110 is a source/drain contact in this example. Referring to FIG. 1B, the conductive feature 112 are transistor source/drain regions (also referred to as source/drain regions 112) of the structure 100. The source/drain regions 112 are adjacent to gate structures 111. Gate sidewall spacers 113 are disposed over sidewalls of the gate structures 111. The etch stop layer 114 is disposed over the source/drain regions 112 and the gate sidewall spacers 113. In some embodiments, the source/drain regions 112 may include lightly doped source/drain (LDD) features, heavily doped source/drain (HDD) features, and/or epitaxially grown semiconductor features. Each of the gate structures 111 includes a gate dielectric layer and a gate electrode layer. The gate dielectric layer may include silicon oxide ($SiO_2$) or a high-k dielectric material such as hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate ($SrTiO_3$), other suitable metal-oxides, or combinations thereof. The gate electrode layer may include polysilicon or one or more metals such as titanium (Ti), aluminum (Al), tungsten (W), cobalt (Co), copper (Cu), and/or other suitable materials. The gate sidewall spacers 113 may include one or more dielectric materials, such as silicon dioxide, silicon nitride, silicon oxynitride, other dielectric materials, or combinations thereof.

Figure 1C:
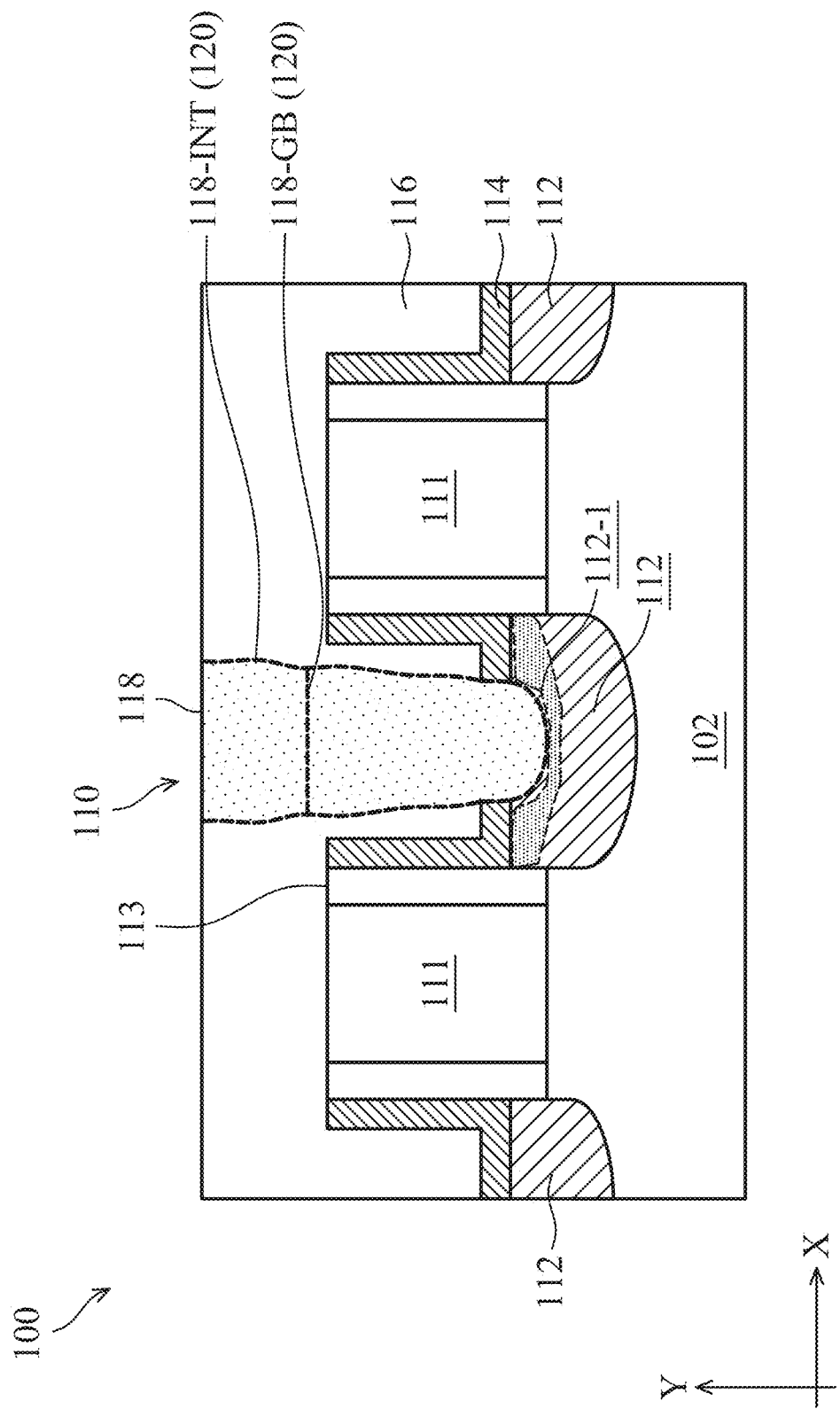
Figure 1D:
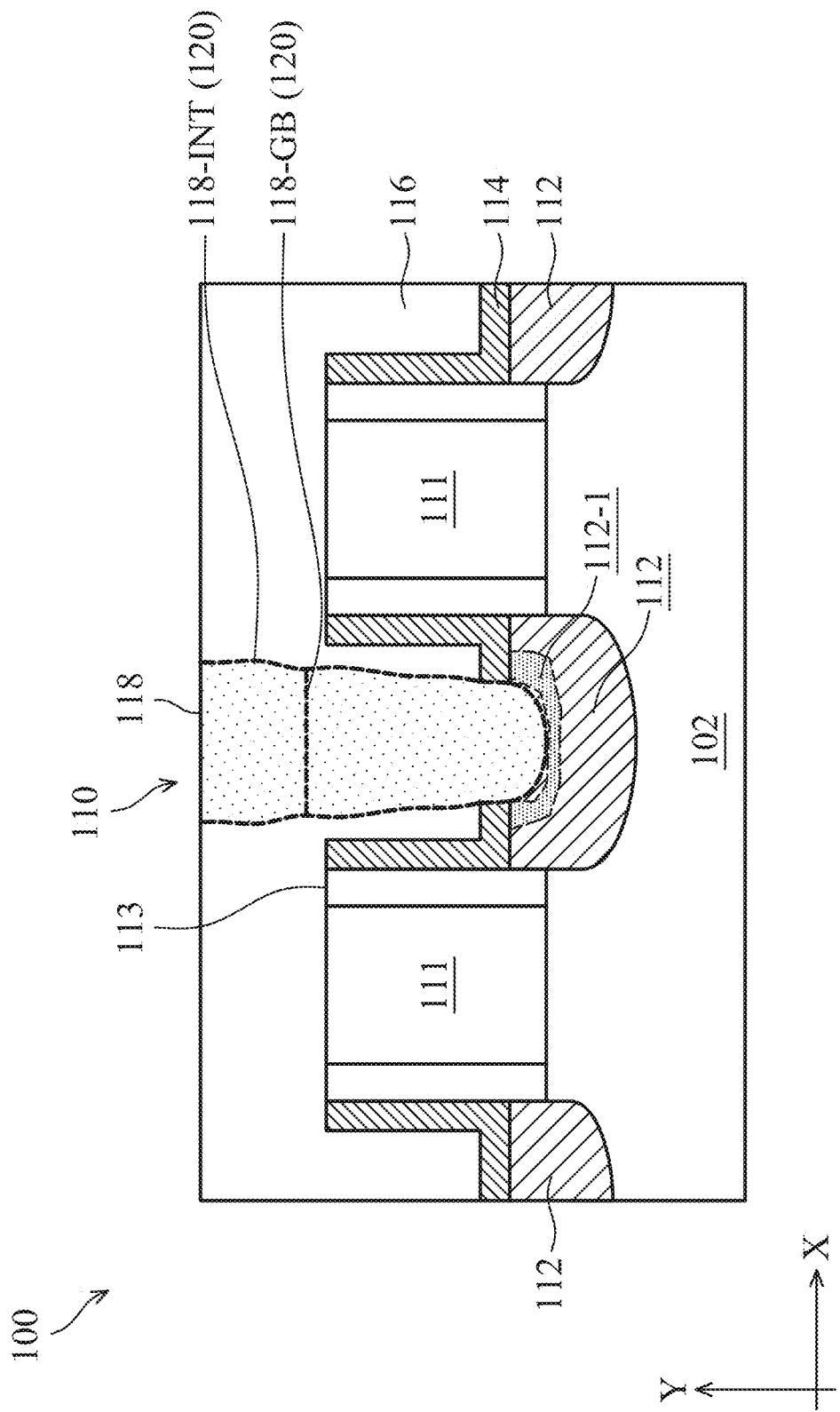

FIGS. 1C and 1D illustrate two examples of the structure 100 where the plug 110 is disposed over a source/drain electrode that includes a silicide feature 112-1. The silicide feature 112-1 may include a nickel silicide, titanium silicide, cobalt silicide, or other suitable silicidation or germanosilicidation, and can be formed by depositing a metal or metal compound over the source/drain 112 which includes one or more semiconductor materials, annealing the structure so that the metal or metal compound reacts with the one or more semiconductor materials, and removing the unreacted metal or metal compound. Other aspects of FIGS. 1C-1D are the same as FIG. 1B. The interface between the first metal 118 and the silicide feature 112-1 is part of the interface 118-INT. FIG. 1C shows an example where the silicide feature 112-1 is formed before the etch stop layer 114 is formed and the silicide feature 112-1 covers an entire top surface of the source/drain 112. FIG. 1D shows an example where the silicide feature 112-1 is formed after the etch stop layer 114 and the dielectric layer 116 are formed and the silicide feature 112-1 covers a part of the top surface of the source/drain regions 112 that is exposed during contact hole formation.

Figure 2:
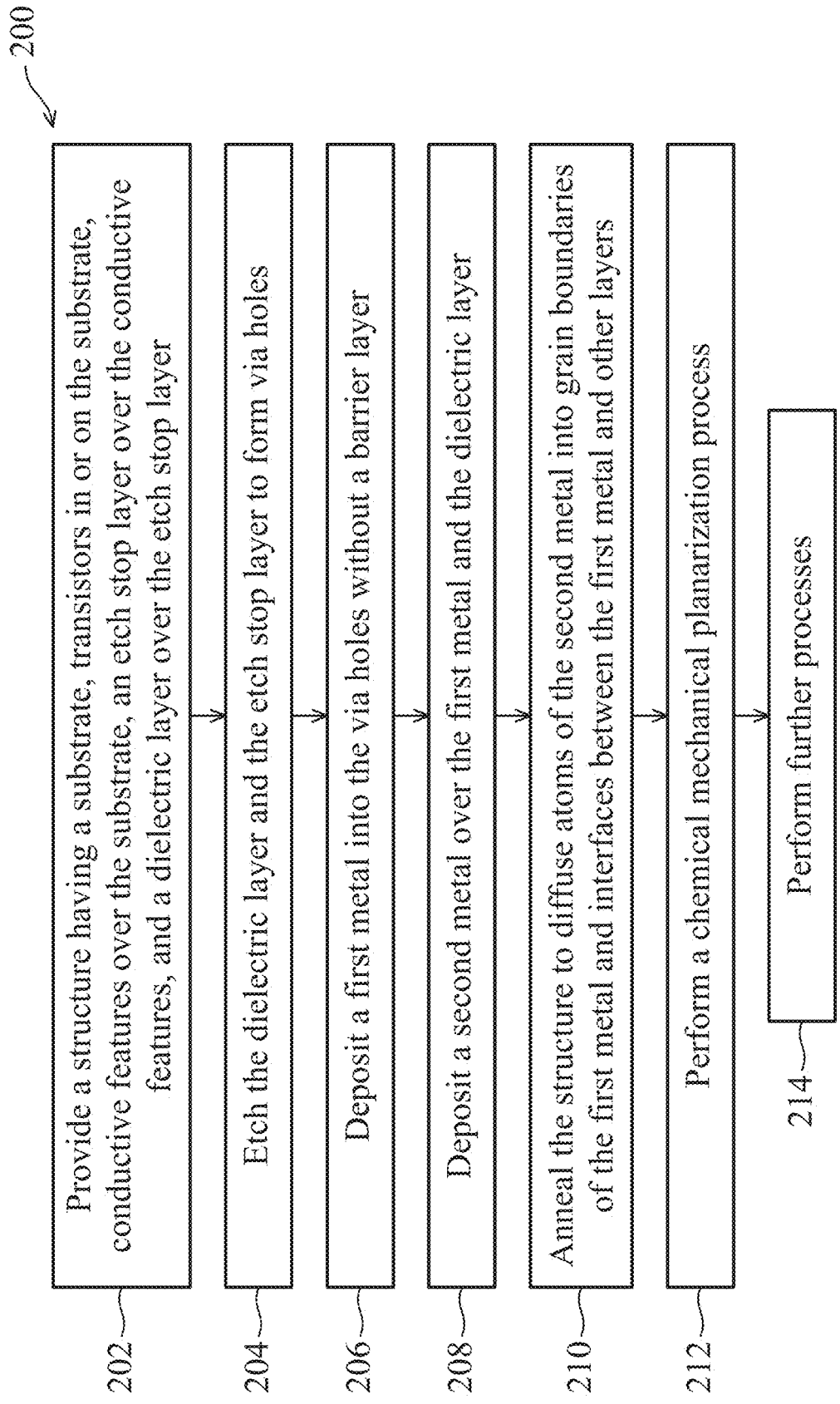
FIG. 2 shows a flow chart of a method for forming the semiconductor structure shown in FIGS. 1A-1D, according to aspects of the present disclosure.

FIG. 2 illustrates a flow chart of a method 200 for forming the semiconductor device 100 in accordance with some embodiments. The method 200 is merely an example and is not intended to limit the present disclosure beyond what is explicitly recited in the claims. Additional operations can be provided before, during, and after the method 200, and some operations described can be replaced, eliminated, or moved around for additional embodiments of the method. The method 200 is described below in conjunction with FIGS. 3A-3F, which illustrate various cross-sectional views of the semiconductor device 100 during fabrication steps according to the method 200.

Referring to FIG. 2, at operation 202, the method 200 provides (or is provided with) a structure (or a workpiece) 100 having a substrate, conductive features over the substrate, an optional etch stop layer over the conductive features, and a dielectric layer over the etch stop layer. An example of the structure 100 is shown in FIG. 3A. Referring to FIG. 3A, the structure 100 includes a substrate 102, a conductive feature 112 over the substrate 102, an etch stop layer 114 over the conductive feature 112, and a dielectric layer 116 over the etch stop layer 114. Example materials and compositions of the various layers 102, 112, 114, and 116 have been described with reference to FIG. 1A and are omitted here for the purpose of simplicity. Though not shown in FIG. 3A, the substrate 102 includes active devices (such as transistors) and/or passive devices. The conductive feature 112 may be a source electrode, a drain electrode, a gate electrode, a source contact, a drain contact, a gate contact, an interconnect wire, an interconnect via plug, or other suitable conductive element of an IC.

At operation 204, the method 200 etches the structure 100 to form via holes therein. An example of the resultant structure 100 is shown in FIG. 3B. Referring to FIG. 3B, a via hole 117 is formed by etching the dielectric layer 116 and the etch stop layer 114 to expose the conductive feature 112. In the present embodiment, the method 200 also partially etches the conductive feature 112. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. In some embodiments, the operation 204 may include two etching operations. A first etching operation is selective to the material(s) of the dielectric layer 116 and stops at the etch stop layer 114, and a second etching operation is selective to the material(s) of the etch stop layer 114. The operation 204 may also include a post-etch cleaning process to clean the via hole 117 and to make it ready for the following metal filling process. For example, the cleaning process may be a wet cleaning process, such as an SC1 (Standard Clean 1) or SC2 (Standard Clean 2) process. In some embodiments, the critical dimension of the via hole 117 (a dimension along the "X" direction, for example, measured at the lower portion of the via hole 117) is about 10 nm or less, which may be too small to be filled with a traditional plug with a barrier layer.

Figure 3C:
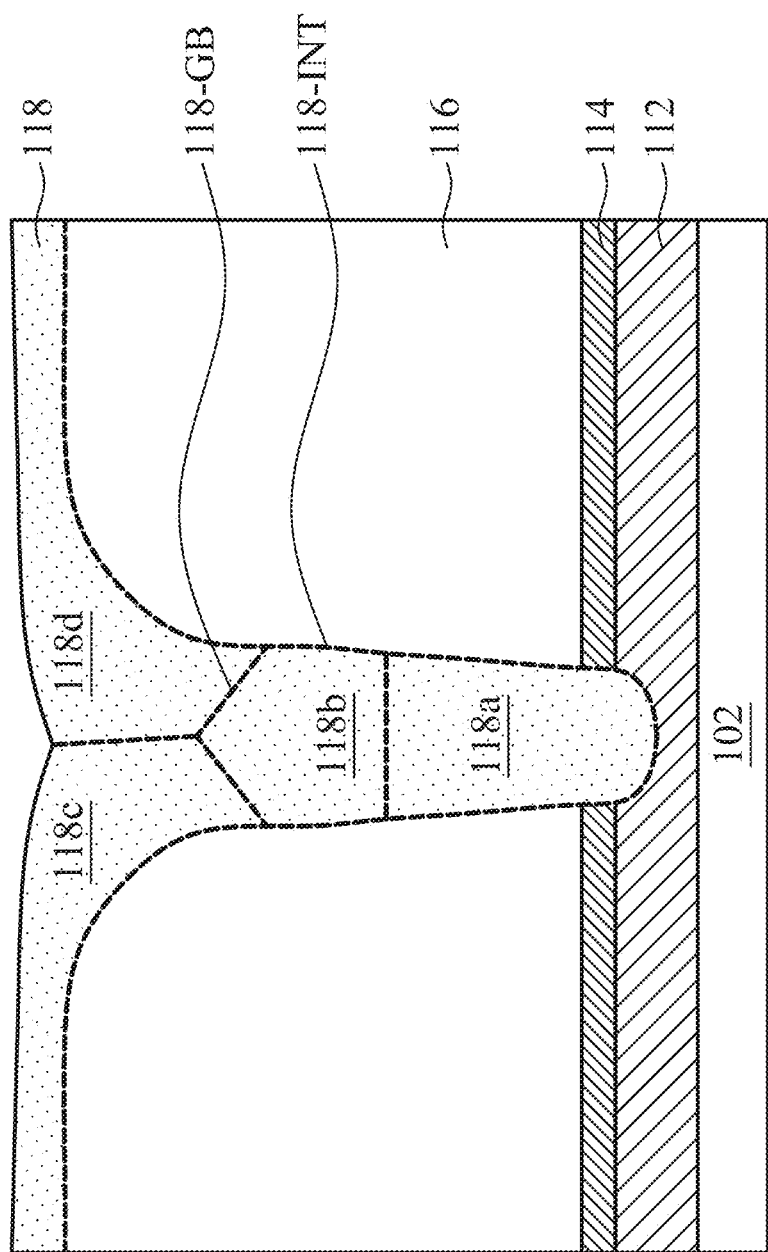

At operation 206, the method 200 deposits a first metal 118 into the via hole 117. An example of the resultant structure 100 is shown in FIG. 3C. The first metal 118 substantially fills the via hole 117. Unlike the traditional processes, the method 200 does not deposit a barrier layer prior to filling the via hole 117 with the first metal 118. This is because the via hole 117 is very small and does not have enough room for both a barrier layer and a metal fill layer while still providing low electrical resistance. In various embodiments, the first metal 118 may include ruthenium, rhodium, iridium, molybdenum, tungsten, or another suitable metal for low electrical resistance and hole-filling capability. The operation 206 may use any suitable deposition technique such as CVD, PVD, and plating (for example, electrochemical plating or ECP).

Figure 8A:
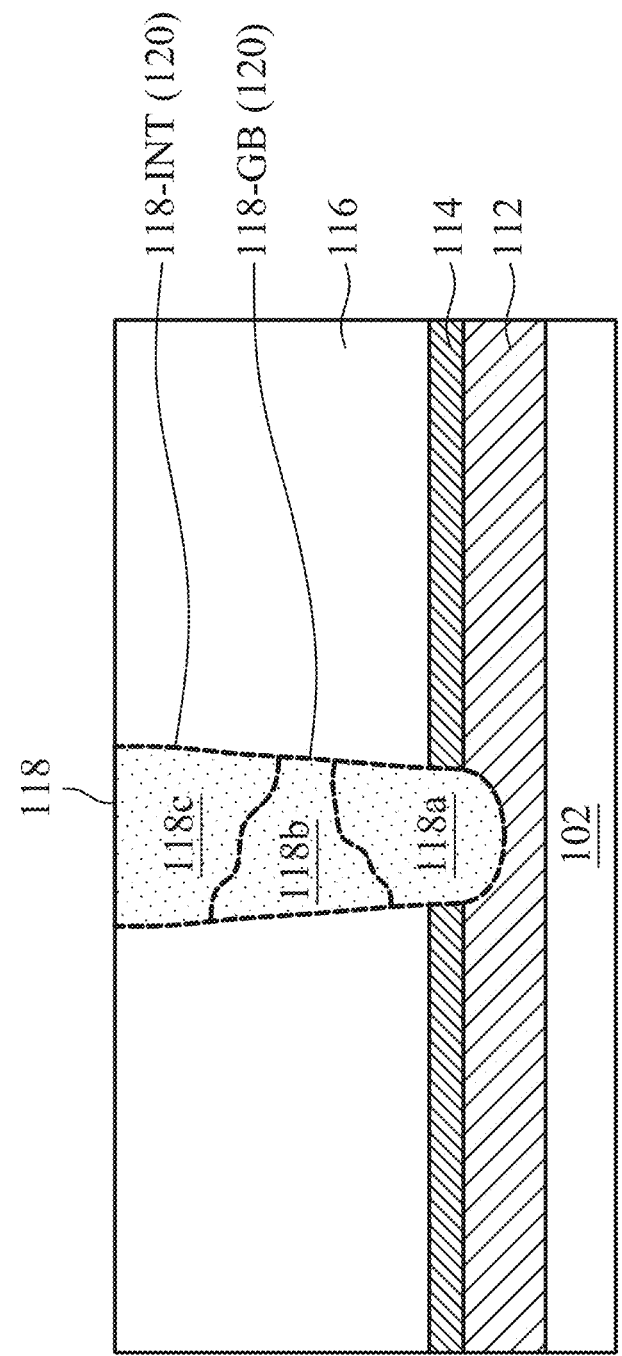
FIGS. 8A and 8B illustrate cross-sectional views of a semiconductor structure of the present disclosure.
Figure 8B:
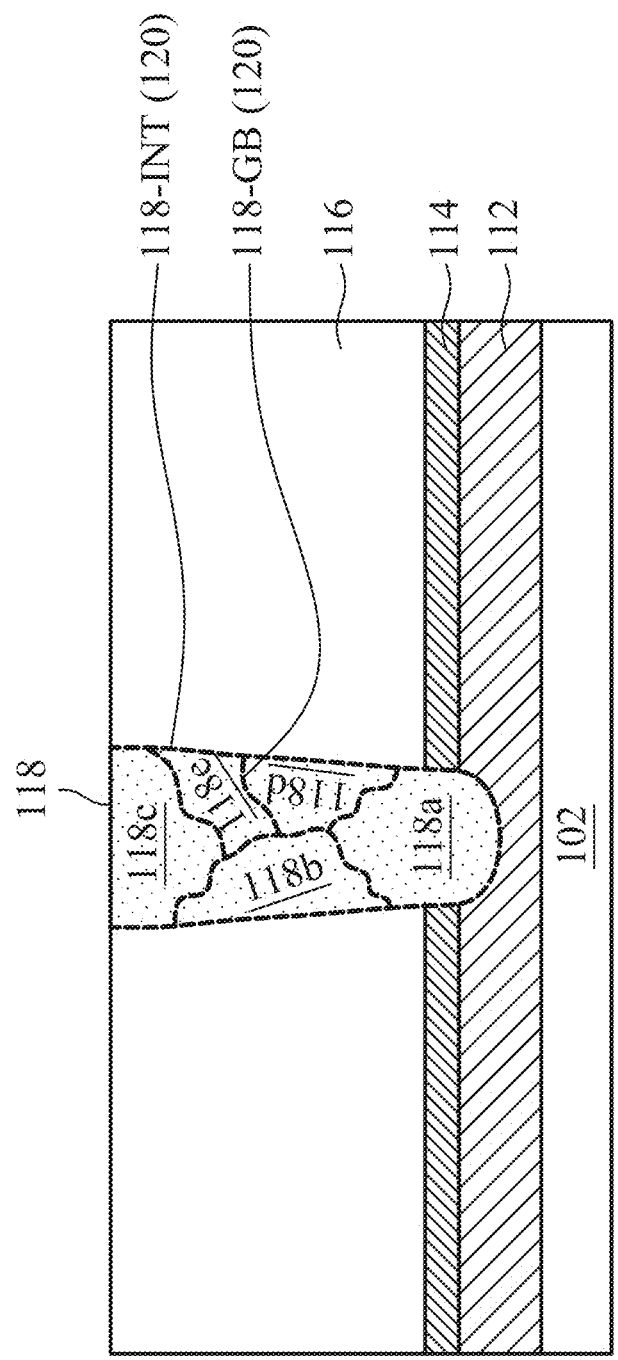

In various embodiments, the deposition (or growth) of the first metal 118 starts from the bottom of the via hole 117 as well as from the sidewalls of the via hole 117. This results in multiple grains of the first metal 118 growing from different sites and at different orientations. These grains eventually meet one another within the via hole 117, forming various grain boundaries 118-GB. In the example shown in FIG. 3C, there are four grains of the first metal 118: 118a, 118b, 118c, and 118d, and the example boundaries among them are illustrated with the dashed line 118-GB. In various embodiments, the grains of the first metal 118 may be arranged bottom-up, side-to-side, or a mix of bottom-up and side-to-side within the via hole 117. FIGS. 8A and 8B illustrate some examples of the first metal 118 having multiple grains in the via hole 117 post the operation 212 (CMP). Particularly, FIG. 8A illustrates three grains 118a, 118b, and 118c stacked bottom-up and FIG. 8B illustrates five grains in a mix of bottom-up and side-to-side configuration. Also, the grains of the first metal 118 may be of different sizes and/or shapes, depending on the metal species and deposition conditions. For example, when the first metal 118 is primarily ruthenium, the grains are smaller when the deposition temperature is 400° C. or lower than when the deposition temperature is above 400° C. When the grains are big, they tend to stack bottom-up in the via hole 117. When the grains are small, they tend to distribute both side-to-side and bottom-up. FIG. 3C also illustrates the interface 118-INT between the first metal 118 and the surrounding structures including, for example, the dielectric layer 116, the etch stop layer 114, and the conductive feature 112. The inventors of the present disclosure have discovered that the grain boundaries 118-GB and the interface 118-INT, if not treated properly, are prone to manufacturing defects such as pitting defects or grooving defects caused by subsequent thermal processes. For example, the grains of the first metal 118 may contract or move, and the materials of the dielectric layer 116 (e.g., silicon dioxide) may diffuse into the grain boundaries 118-GB, each of which is undesirable. The method 200 of the present disclosure treats the first metal 118 to avoid or reduce the above issues.

Figure 3D:
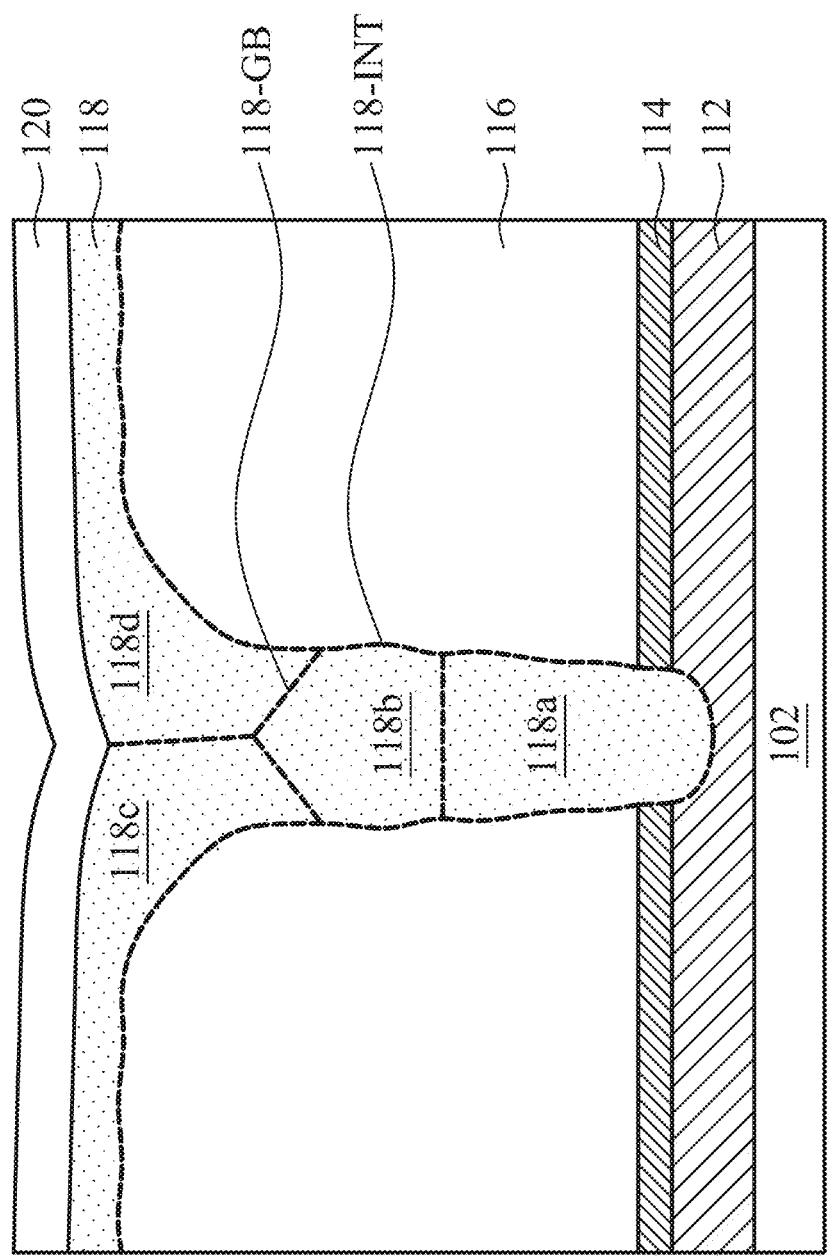

At operation 208, the method 200 (FIG. 2) deposits a second metal 120 over the first metal 118. An example of the resultant structure 100 is shown in FIG. 3D. In the present embodiment, the second metal 120 has a lower melting point than the first metal 118. For example, the first metal 118 may include one of ruthenium, iridium, molybdenum, and tungsten; and the second metal 120 may include a metal different from the first metal 118 and has a lower melting point, such as cobalt, nickel, or rhodium. The second metal 120 may be deposited using any suitable techniques such as CVD, PVD, ALD, or plating. For example, cobalt may be deposited using CVD with a precursor selected from CCTBA (dicobalt hexacarbonyl tert-butylacetylene or a derivative thereof), CCTMSA (dicobalt hexacarbonyl trimethylsilyl acetylene), or CCBTMSA (cobalt carbonyl bis (trimethylsilyl acetylene)). Cobalt may also be deposited using ECP (electrochemical plating), ALD, or PVD. For example, nickel may be deposited using ECP, PVD, ALD, or CVD with suitable precursor(s). For example, rhodium may be deposited using CVD with a precursor selected from Di-µ-chloro-tetrakis (trifluorophosphine) dirhodium (I)(($PF_3$)$_2$RhCl)$_2$ or RhCl$_3$ or hydridotetrakis (trifluorophosphine) complexes, [RhCl($PF_3$)$_2$]$_2$, or [RhXL$_2$](2) (X=Cl, Br, or I; L=CO, PH$_3$, or PF$_3$). Rhodium may also be deposited using ECP, PVD, or ALD.

At operation 210, the method 200 (FIG. 2) anneals the structure 100 such that atoms of the second metal 120 diffuse into the grain boundaries 118-GB and the interface 118-INT. In some embodiments, atoms of the second metal 120 also diffuse into the grains of the first metal 118. In an embodiment, the annealing is performed at a temperature in a range from one eighth (⅛) to one half (½) of the melting point of the second metal 120, such as from one quarter (¼) to one half (½) of the melting point of the second metal 120. For example, when the second metal 120 includes cobalt, nickel, or rhodium, the annealing may be performed at a temperature in a range from 300° C. to 500° C., such as from 400° C. to 500° C. or at about 450° C. These temperatures or temperature ranges are found to effectively move (or diffuse) the atoms of the second metal 120 without causing negative side effects to the structure 100. If the annealing temperature is higher than the specified range, some conductive features of the structure 100 (e.g., gate electrodes, source/drain contacts, metal wires, and/or the first metal 118) may deform. If the annealing temperature is lower than the specified range, the atoms of the second metal 120 might not diffuse well. Thus, the specified temperature ranges above have been found to be particularly suitable for operation 210. Further, the annealing is performed with a generally inactive carrier gas to prevent oxidation of the first and the second metals. The carrier gas may be a noble gas such as argon (Ar), nitrogen gas (N$_2$), hydrogen gas (H$_2$), nitrogen-hydrogen gas (N$_2$H$_2$), ammonia (NH$_3$), other suitable gases, or a mixture thereof. The annealing may be performed for a few minutes, such as about 3 to 6 minutes.

Figure 3E:
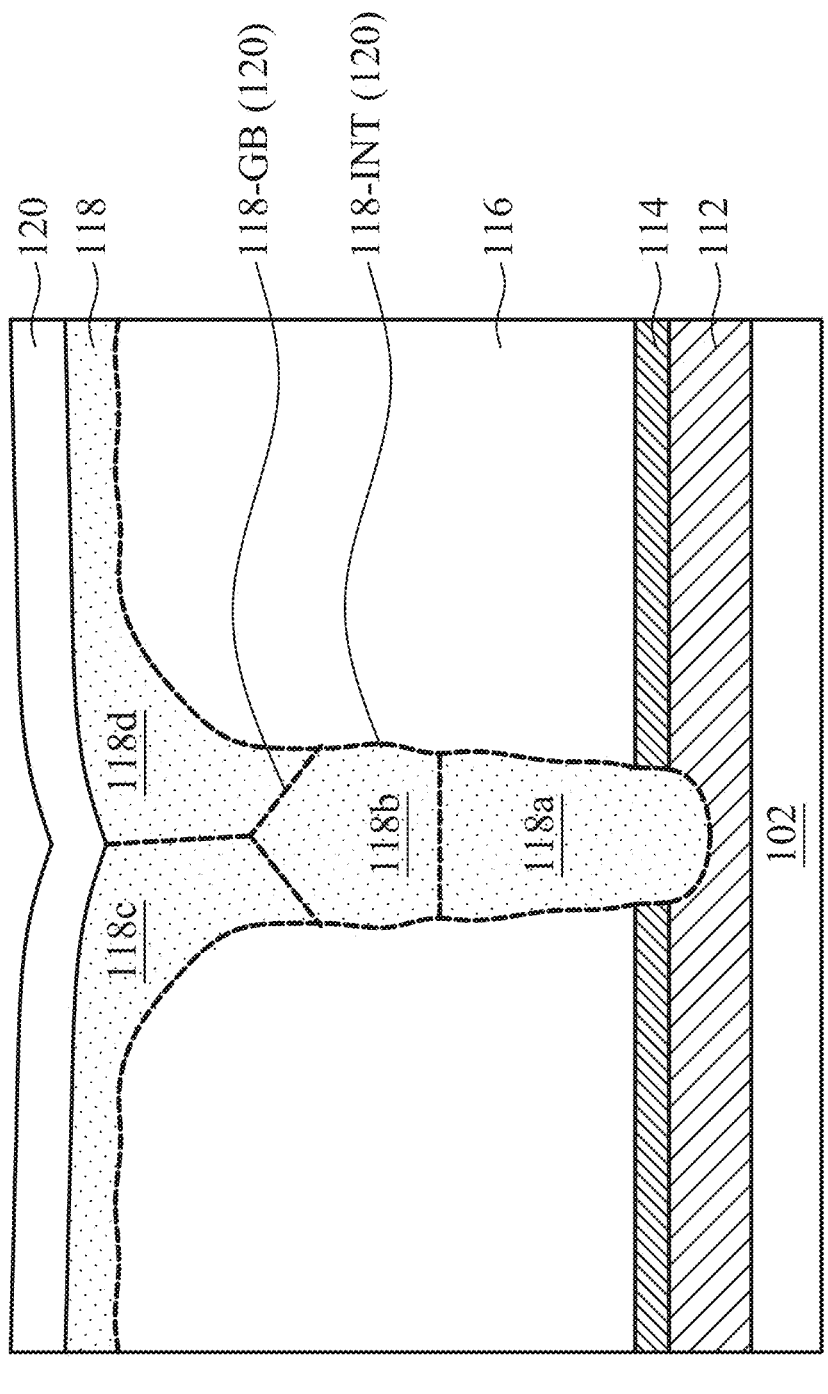

During the annealing, atoms of the second metal 120 diffuse along the grain boundaries 118-GB and the interface 118-INT, which are labeled as 118-GB (120) and 118-INT (120) in FIG. 3E to indicate the presence of the second metal 120 therein. In various embodiments, the ratio of the second metal 120 to the first metal 118 (in terms of metal volume or atom counts) along the grain boundaries 118-GB is in a range from 10% to 90%. Also, in various embodiments, the ratio of the second metal 120 to the first metal 118 along the interface 118-INT is in a range from 10% to 90%, indicating that both the first metal 118 and the second metal 120 are in direct contact with the surrounding structures such as the dielectric layer 116, the etch stop layer 114, and the conductive feature 112. Because of the presence of the second metal 120 in the grain boundaries 118-GB and the interface 118-INT, the barrier-less plug 110 (FIGS. 1A-1D or FIG. 3F) become more stable in subsequent thermal processes, thereby preventing or reducing the defects therein. In an embodiment, atoms of the second metal 120 also diffuse into the grains of the first metal 118. In some further embodiments, the ratio of the second metal 120 to the first metal 118 within the grains of the first metal 118 is lower than the ratio of the second metal 120 to the first metal 118 along the grain boundaries 118-GB and the interface 118-INT. For example, the ratio of the second metal 120 to the first metal 118 within the grains of the first metal 118 may be in a range from 5% to 40% in various embodiments.

Figure 3F:
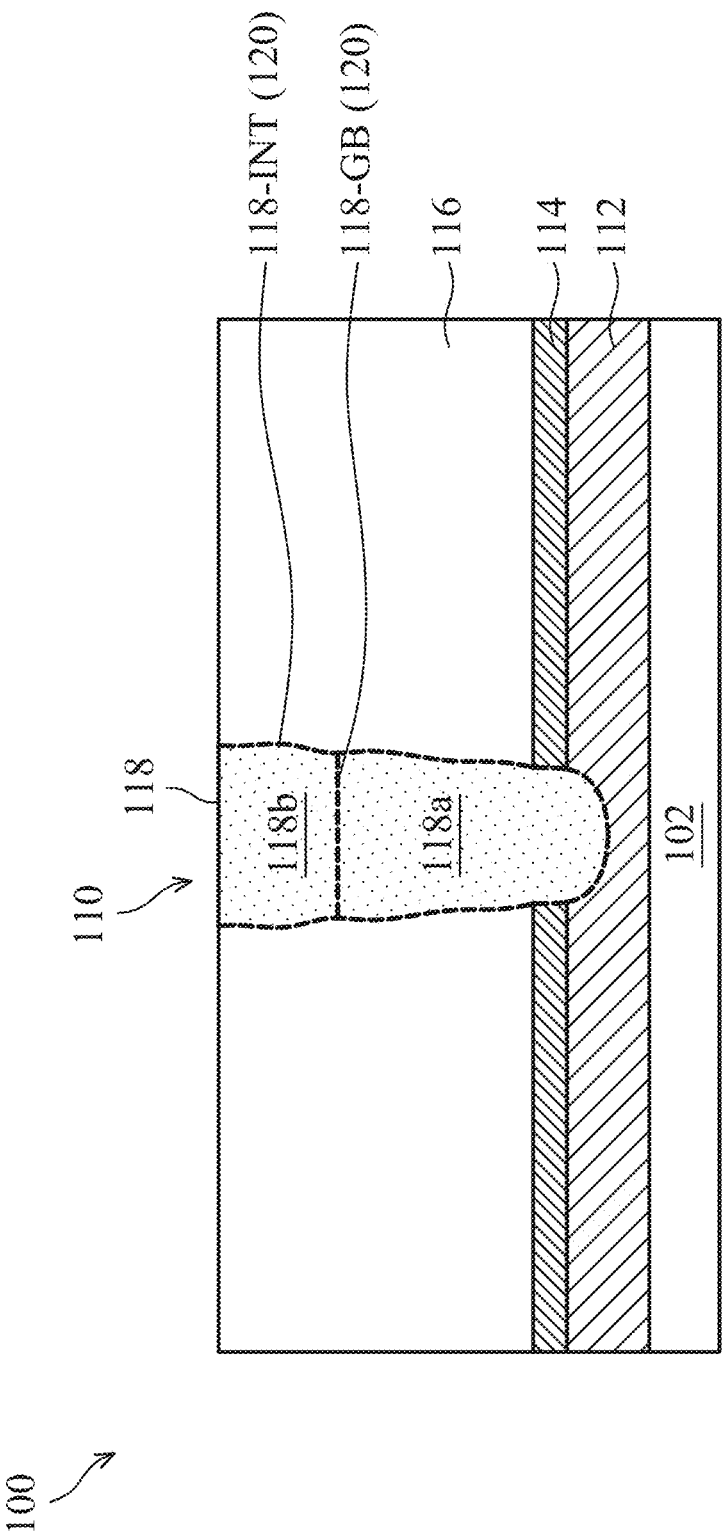

At operation 212, the method 200 (FIG. 2) performs a chemical mechanical planarization (CMP) process to remove excessive materials from the structure 100, which includes portions of the second metal 120 and the first metal 118 that are above the dielectric layer 116. In the present embodiment, the CMP process also removes a portion of the first dielectric layer 116 along with portions of the second metal 120 and the first metal 118 within the via hole to reach a desired height for the via plug 110. An example of the resultant structure 100 is shown in FIG. 3F. Referring to FIG. 3F, the barrier-less plug 110 is reduced to have only two grains 118a and 118b of the first metal 118. The second metal 120 is distributed along the grain boundary 118-GB and the interface 118-INT. In the present embodiment, the two grains 118a and 118b are stacked one over another. In an alternative embodiment, the two grains 118a and 118b may be arranged side by side laterally (though not shown). In another embodiment, the structure 100 includes only one grain (such as 118a) of the first metal 118 and the second metal 120 is distributed along the interface 118-INT. In some embodiments, the structure 100 may include more than two grains of the first metal 118, and the grains may be arranged bottom-up vertically and/or side-by-side laterally.

At operation 214, the method 200 (FIG. 2) performs further processes to the device 100 to form a semiconductor device, such as an IC. For example, the method 200 may form an interconnect wiring layer above the barrier-less plug 110 and electrically connecting to the barrier-less plug 110. This may involve multiple operations, such as depositing an interlayer dielectric layer (ILD) over the dielectric layer 116 and the barrier-less plug 110, etching the ILD to form trenches and to expose the barrier-less plug 110 in the trenches, filling the trenches with one or more metals, and performing a CMP process to the one or more metals and the ILD. The remaining portion of the one or more metals becomes an interconnect layer electrically connecting to the barrier-less plug 110. During the various operations, the structure 100 may be subject to one or more thermal processes. With the second metal 120 stabilizing the first metal 118, the barrier-less plug 110 is able to maintain its integrity during these processes.

Figure 4:
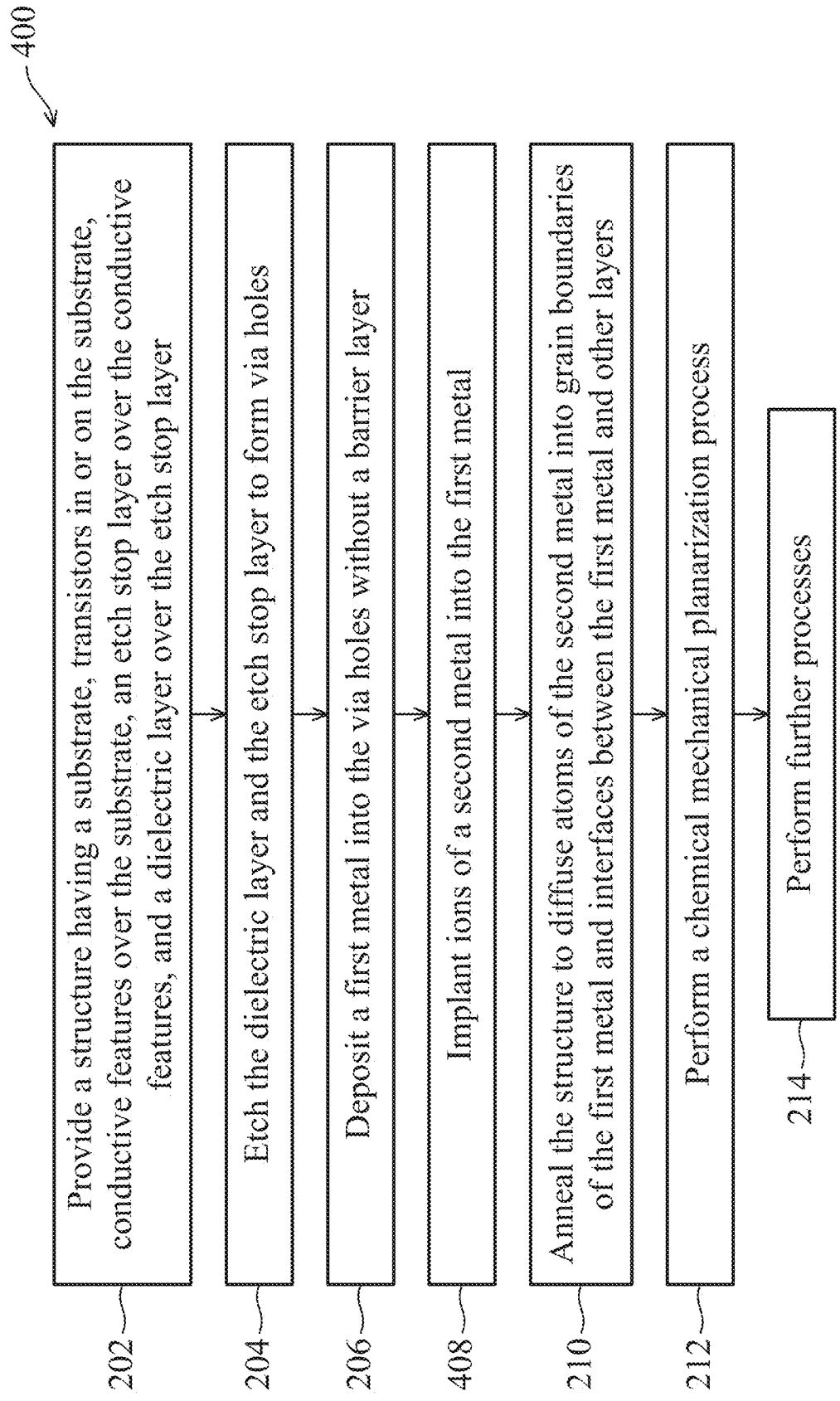
FIG. 4 shows a flow chart of another method for forming the semiconductor structure shown in FIGS. 1A-1D, according to aspects of the present disclosure.

FIG. 4 illustrates a flow chart of a method 400 for forming the semiconductor device 100 in accordance with another embodiment. The method 400 is merely an example and is not intended to limit the present disclosure beyond what is explicitly recited in the claims. Additional operations can be provided before, during, and after the method 400, and some operations described can be replaced, eliminated, or moved around for additional embodiments of the method. The method 400 is described below in conjunction with FIGS. 5A-5D, which illustrate various cross-sectional views of the semiconductor device 100 during fabrication steps according to the method 400.

Referring to FIG. 4, in the present embodiment, the method 400 includes operations 202, 204, 206, 210, 212, and 214, which have been described with reference to FIG. 2. After the operation 206, the method 400 further includes an operation 408 for implanting ion species of a second metal 120 into a first metal 118. The method 400 is further described below.

Figure 5A:
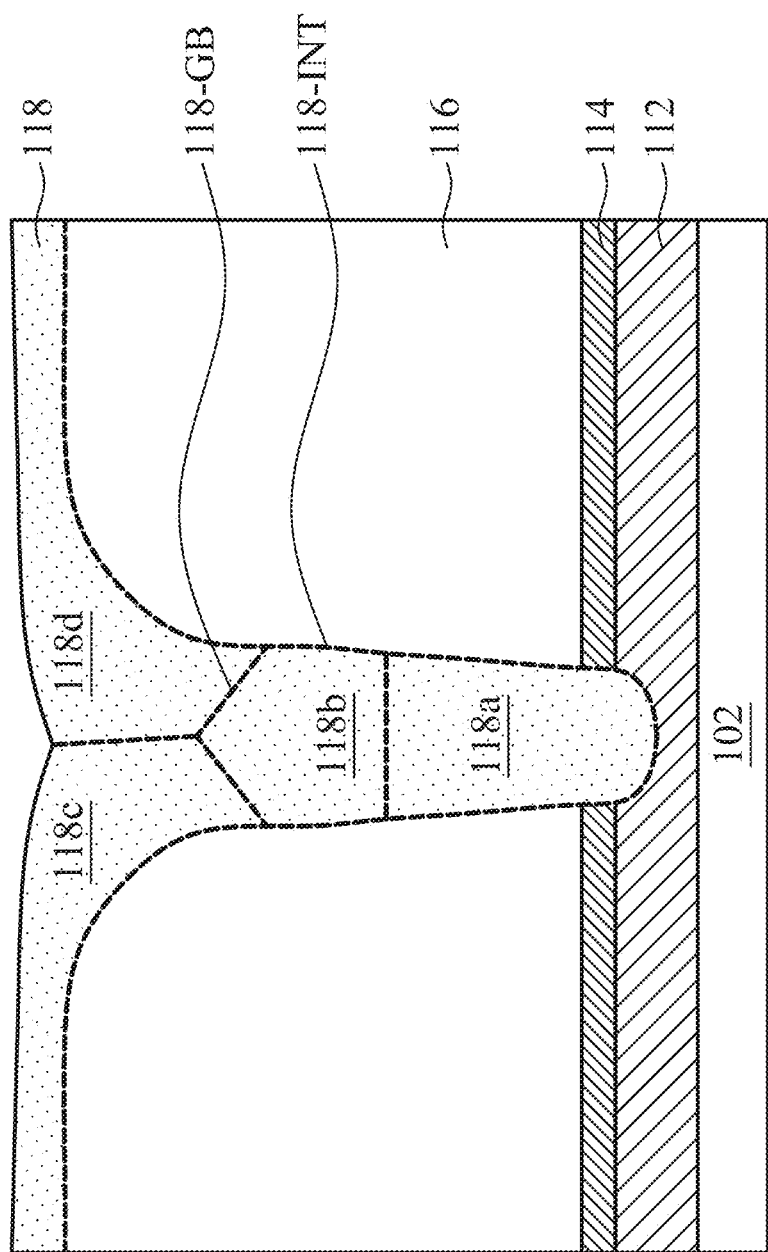
FIGS. 5A, 5B, 5C, and 5D illustrate cross-sectional views of a semiconductor structure during various fabrication steps according to the method of FIG. 4, in accordance with some embodiments.

At operation 202, the method 400 provides (or is provided with) a structure (or a workpiece) 100 having a substrate, conductive features over the substrate, an optional etch stop layer over the conductive features, and a dielectric layer over the etch stop layer. At operation 204, the method 400 etches the structure 100 to form via holes therein. At operation 206, the method 400 deposits a first metal 118 into the via hole. After the operations 202, 204, and 206 of the method 400, the resultant structure 100 is shown in FIG. 5A. Referring to FIG. 5A, the structure 100 includes a substrate 102, a conductive feature 112, an etch stop layer 114, a dielectric layer 116, and a first metal 118. The first metal 118 fills a via hole 117 (see FIG. 3B) in the layers 116, 114, and 112, and directly contacts the various layers. The interface between the first metal 118 and the surrounding structures is indicated with a dashed line 118-INT. The first metal 118 includes multiple grains, such as the grains 118a, 118b, 118c, and 118d. The boundaries among the grains are indicated with dashed lines 118-GB. If not treated properly, the grain boundaries 118-GB and the interface 118-INT may cause manufacturing defects to the structure 100 such as pitting defects or grooving defects. The method 400 of the present disclosure treats the first metal 118 to avoid or to reduce the above issues.

Figure 5B:
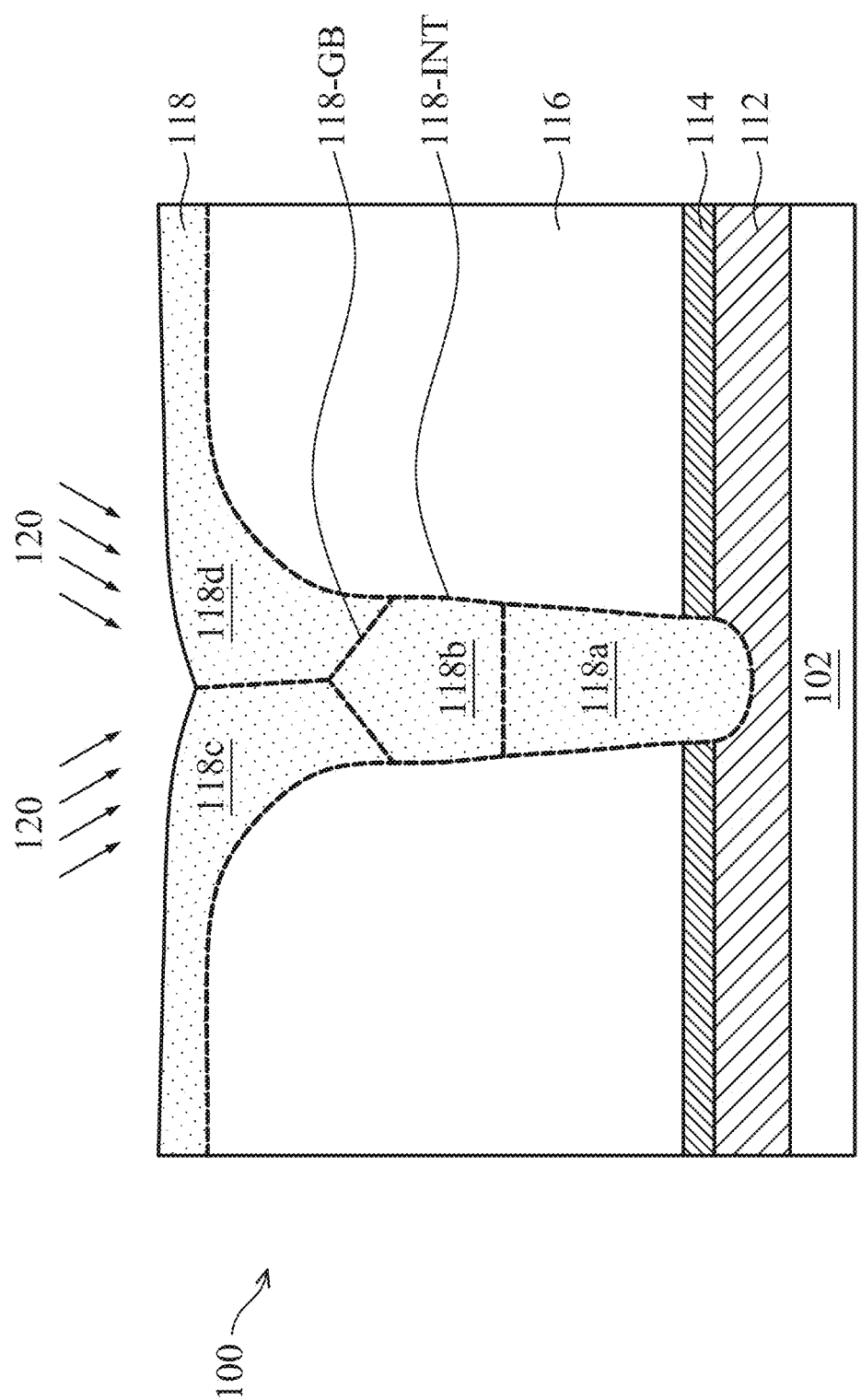

At operation 408, the method 400 (FIG. 4) implants ions of a second metal 120 into the first metal 118, such as illustrated in FIG. 5B. Referring to FIG. 5B, ions of the second metal 120 are implanted into the first metal 118, for example, using a tilted ion implantation process. In an embodiment, the ion implantation process uses a tilt angle in a range from 0 to 30 degrees and implantation energy in a range from 2 keV to 15 keV. The selection of the tilt angle and the implantation energy depends on the height and the critical dimension of the via hole 117 (FIG. 3B), as well as the height and the critical dimension of the final plug 110 (such as shown in 5D). For via holes that have high aspect ratio (tall and narrow), a smaller tilt angle and/or a higher implantation energy is used so that the ions may reach the middle and lower portions of the first metal 118. For via holes that have low aspect ratio (short and wide), a larger tilt angle and/or a lower implantation energy may be used. In various embodiments, the second metal 120 may have a higher or lower melting point than the first metal 118. For example, the first metal 118 may be ruthenium and the second metal 120 may be one of cobalt, nickel, rhodium, iridium, molybdenum, and tungsten. Other materials for the first and the second metals are also possible. The implanted ion species may be distributed in the grains of the first metal 118, along the grain boundaries 118-GB, and/or along the interface 118-INT.

Figure 5C:
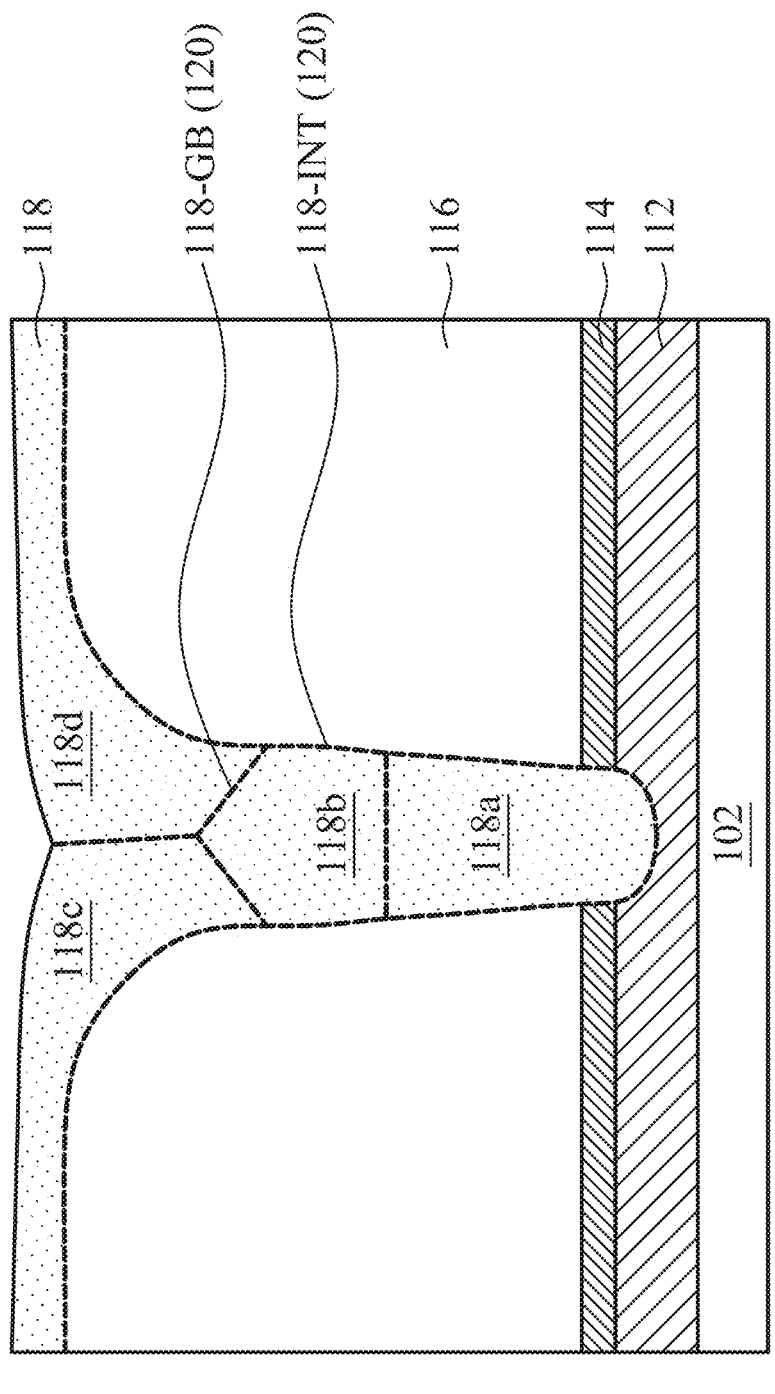

At operation 210, the method 400 (FIG. 4) anneals the structure 100 such that the second metal 120 may further diffuse into the grain boundaries 118-GB and the interface 118-INT and to stabilize the grains of the first metal 118. The resultant structure 100 is shown in FIG. 5C. In an embodiment, the annealing is performed at a temperature in a range from one eighth (⅛) to one half (½) (such as from one quarter (¼) to one half (½)) of the lower one of the melting point of the first metal 118 and the second metal 120. For example, when the first metal 118 includes ruthenium and the second metal 120 includes cobalt, nickel, or rhodium, the annealing may be performed at a temperature in a range from 300° C. to 500° C., such as from 400° C. to 500° C. or at about 450° C. These temperatures or temperature ranges are found to effectively move (or diffuse) the atoms of the second metal 120 without causing negative side effects to the structure 100. Further, the annealing is performed with a generally inactive carrier gas to prevent oxidation of the first and the second metals. The carrier gas may be a noble gas such as argon (Ar), nitrogen gas ($N_2$), hydrogen gas ($H_2$), nitrogen-hydrogen gas ($N_2H_2$), ammonia ($NH_3$), other suitable gases, or a mixture thereof. The annealing may be performed for a few minutes, such as about 5 minutes. In various embodiments, a first ratio of the second metal 120 to the first metal 118 (in terms of metal volume or atom counts) along the grain boundaries 118-GB and the interface 118-INT is in a range from 10% to 90%, and a second ratio of the second metal 120 to the first metal 118 within the grains of the first metal 118 is lower than the first ratio and may be in a range from 5% to 40%.

Figure 5D:
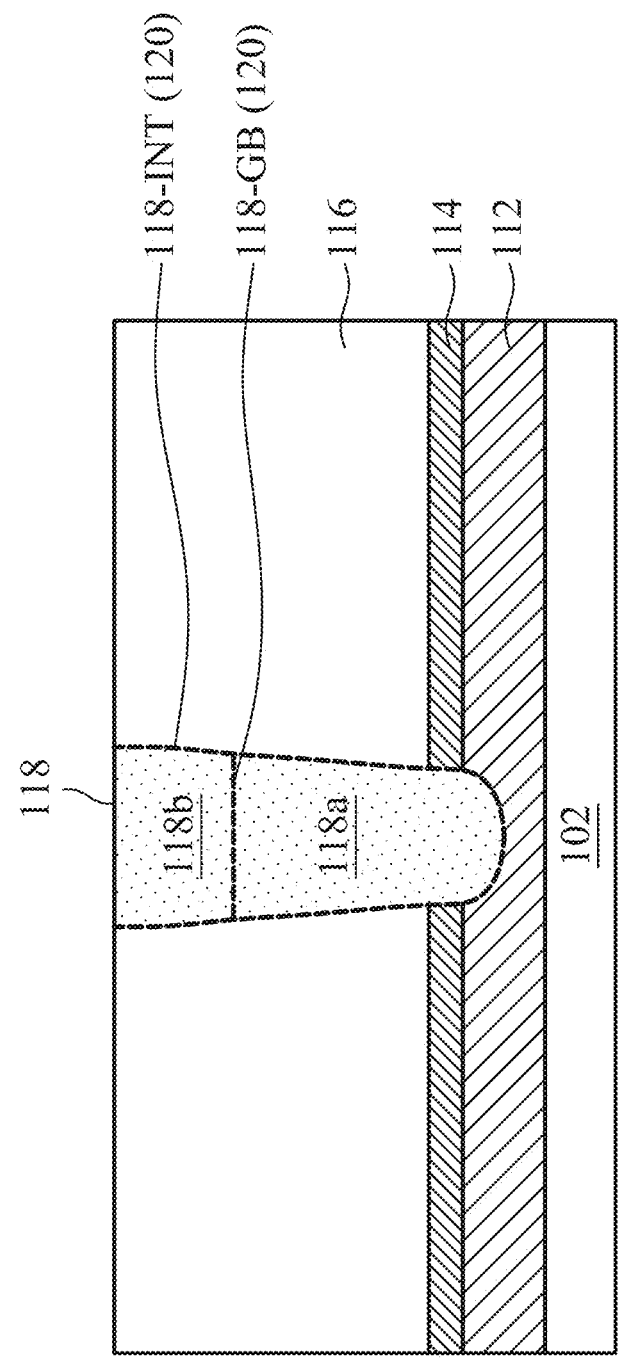

At operation 212, the method 400 (FIG. 4) performs a chemical mechanical planarization (CMP) process to remove excessive materials from the structure 100. For example, the method 400 may remove a portion of the first dielectric layer 116 along with portions of the second metal 120 and the first metal 118 within the via hole to reach a desired height for the barrier-less plug 110. An example of the resultant structure 100 is shown in FIG. 5D, which is substantially the same as the structure 100 shown in FIG. 3F. At operation 214, the method 400 (FIG. 4) performs further processes to the device 100 to form a semiconductor device, such as an IC. For example, the method 400 may form an interconnect wiring layer above the plug 110 and electrically connecting to the barrier-less plug 110, which is similar to the operation 212 of the method 200.

Figure 6:
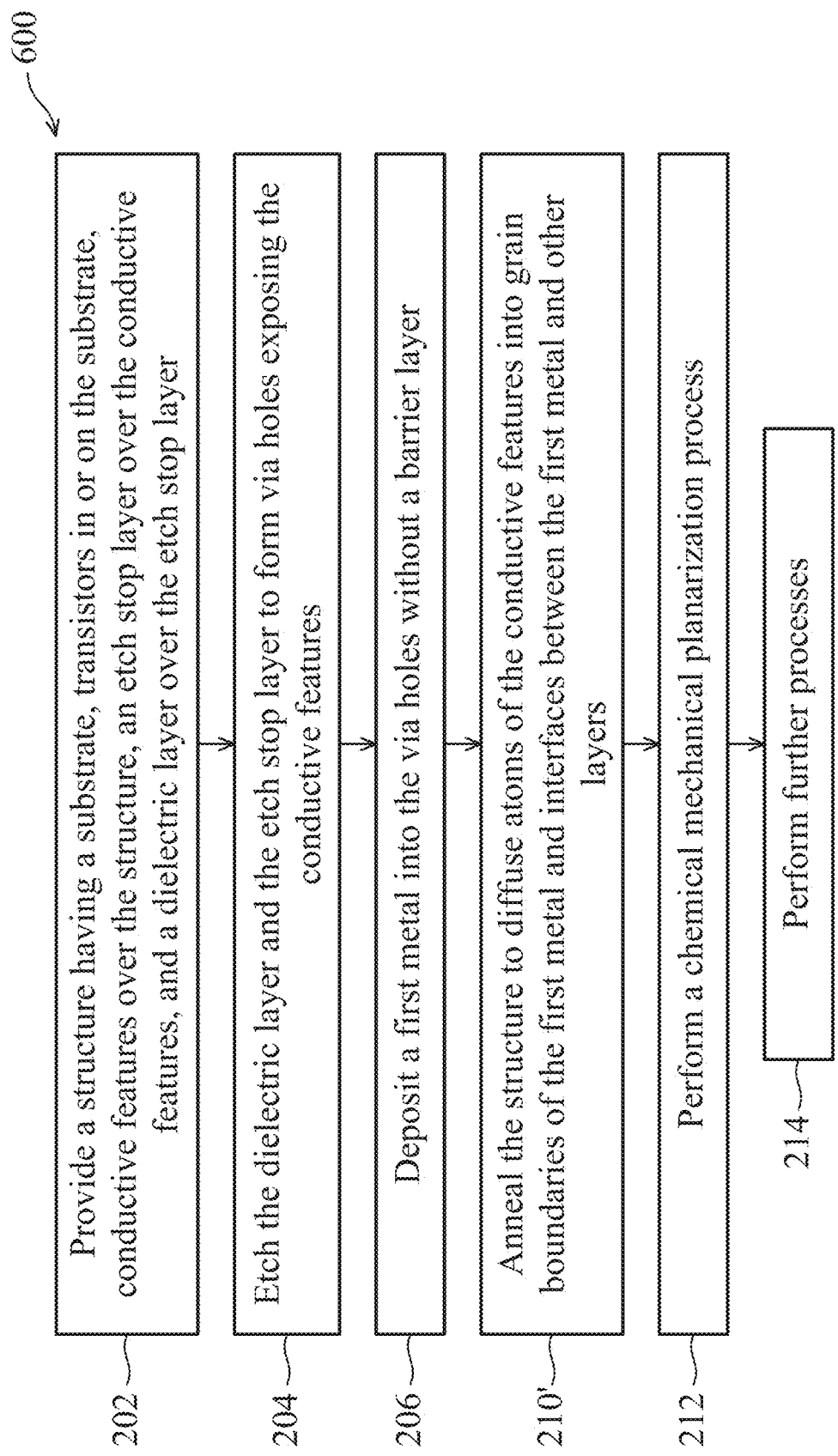
FIG. 6 shows a flow chart of another method for forming the semiconductor structure shown in FIGS. 1A-1D, according to aspects of the present disclosure.

FIG. 6 illustrates a flow chart of a method 600 for forming the semiconductor device 100 in accordance with yet another embodiment. The method 600 is merely an example and is not intended to limit the present disclosure beyond what is explicitly recited in the claims. Additional operations can be provided before, during, and after the method 600, and some operations described can be replaced, eliminated, or moved around for additional embodiments of the method. The method 600 is described below in conjunction with FIGS. 7A-7C, which illustrate various cross-sectional views of the semiconductor device 100 during fabrication steps according to the method 400.

Figure 7A:
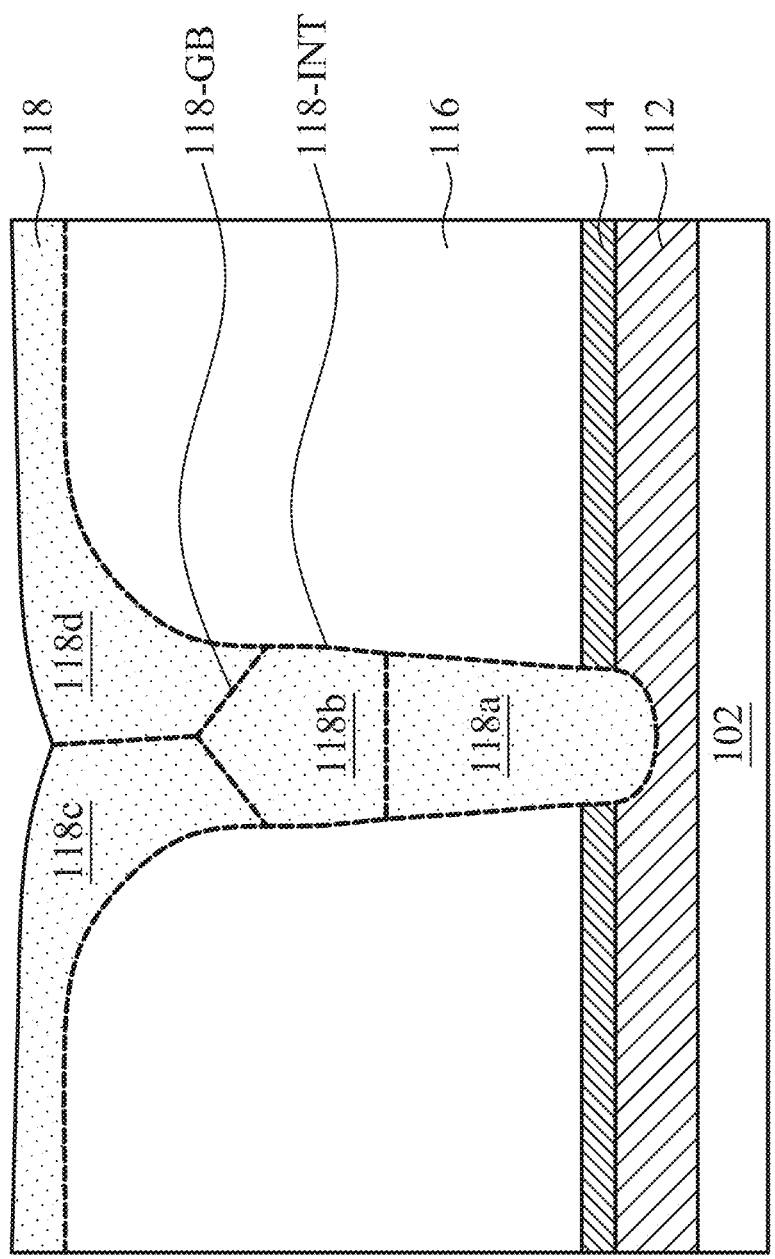
FIGS. 7A, 7B, and 7C illustrate cross-sectional views of a semiconductor structure during various fabrication steps according to the method of FIG. 6, in accordance with some embodiments.
Figure 7B:
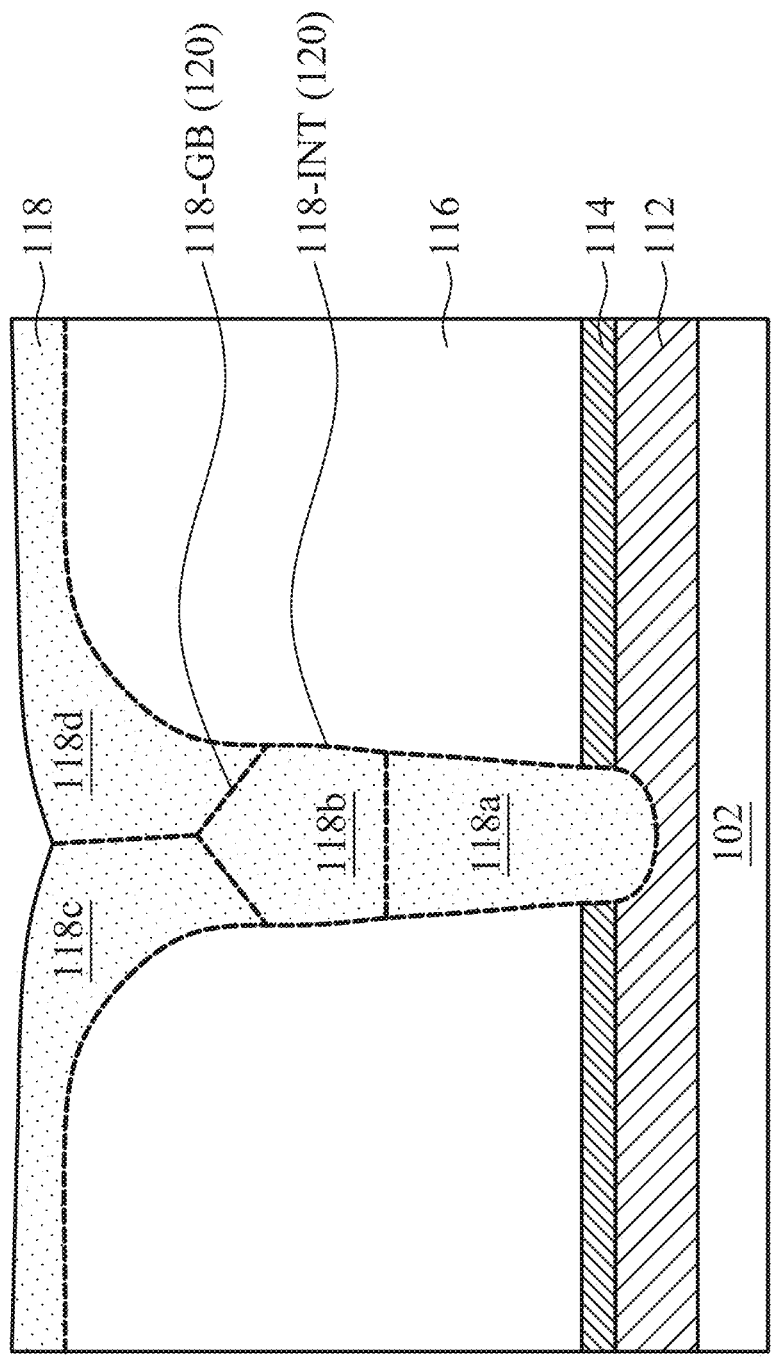

Referring to FIG. 6, the method 600 includes the operations 202, 204, and 206 that have been discussed with reference to FIG. 2. After the operation 206, the resultant structure 100 is shown in FIG. 7A. Referring to FIG. 7A, the structure 100 includes a substrate 102, conductive features 112 over the substrate 102, an optional etch stop layer 114 over the conductive features 112, a dielectric layer 116 over the etch stop layer 114, and a first metal 118. The first metal 118 includes one or more grains, with four grains 118a, 118b, 118c, and 118d shown in this example. The boundaries among the grains are indicated with 118-GB. The interface between the first metal 118 and the surrounding structures including, for example, the dielectric layer 116, the etch stop layer 114, and the conductive feature 112 is indicated with 118-INT.

In this embodiment, the conductive feature 112 includes metal(s) that has a lower melting point than the first metal 118 such that metal elements from the conductive feature 112 may diffuse into the grain boundaries 118-GB and the interface 118-INT during a subsequent annealing process. The metal elements from the conductive feature 112 may also the grains of the first metal 118. For example, the first metal 118 may include one of ruthenium, iridium, molybdenum, and tungsten; and the conductive feature 112 may include a metal different from the first metal 118 and has a lower melting point, such as cobalt, nickel, or rhodium. In an embodiment, the conductive feature 112 is a contact feature, such as a source contact or a drain contact.

At operation 210, the method 600 (FIG. 6) anneals the structure 100 such that atoms of the conductive feature 112 diffuse into the grain boundaries 118-GB and the interface 118-INT. In some embodiments, atoms of the conductive feature 112 also diffuse into the grains of the first metal 118. This operation has been discussed with reference FIG. 2.

Figure 7C:
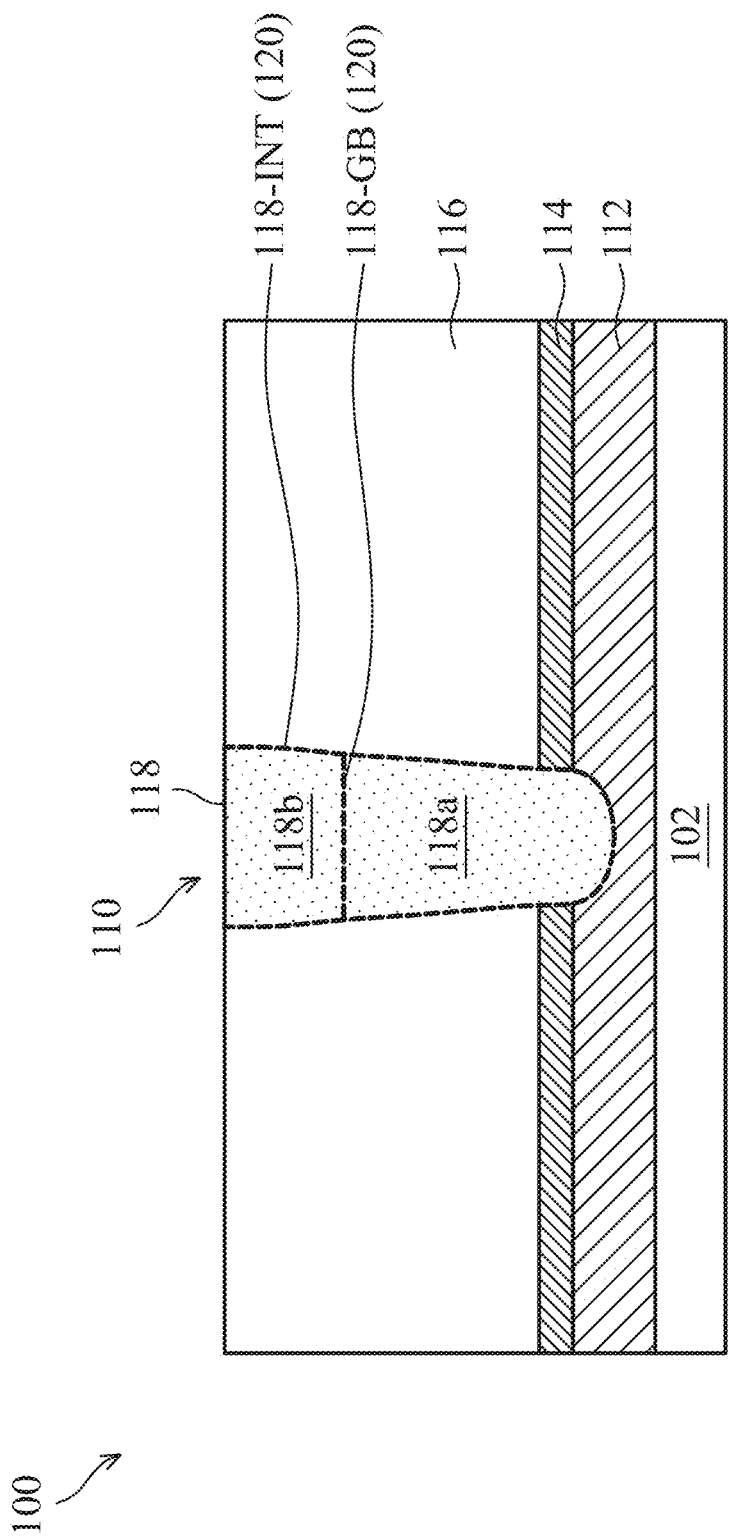

At operation 212, the method 600 (FIG. 6) performs a chemical mechanical planarization (CMP) process to remove excessive materials from the structure 100, which includes portions of the first metal 118 that are above the dielectric layer 116. In the present embodiment, the CMP process also removes a portion of the first dielectric layer 116 along with portions of the first metal 118 within the via hole to reach a desired height for the via plug 110. An example of the resultant structure 100 is shown in FIG. 7C, which is substantially the same as or similar to the structure shown in FIG. 3F. At operation 214, the method 600 (FIG. 6) performs further processes to the device 100 to form a semiconductor device, such as an IC. Aspects of the operations 212 and 214 have been discussed with reference to FIG. 2.

FIGS. 8A and 8B illustrate some examples of the first metal 118 having multiple grains in the via hole 117 post the operation 212 (CMP). Particularly, FIG. 8A illustrates three grains 118a, 118b, and 118c stacked bottom-up and FIG. 8B illustrates five grains 118a, 118b, 118c, 118d, and 118e in a mix of bottom-up and side-to-side configuration. The first metal 118 in each of the embodiments shown in FIGS. 1A-1D, 3F, 5D, and 7C may instead be in the form as shown in FIG. 8A, FIG. 8B, or in other forms.

Although not intended to be limiting, one or more embodiments of the present disclosure provide many benefits to a semiconductor device and the formation thereof. For example, embodiments of the present disclosure provide a barrier-less plug and methods of forming the same. The barrier-less plug has low electrical resistance and stable interface with surrounding dielectric layer(s). The barrier-less plug includes a first metal and a second metal. The first metal occupies a bulk of the barrier-less plug and may have one or more grains. The second metal is distributed along grain boundaries, if any, of the first metal as well as along the interface between the first metal and the surrounding structures. The second metal stabilizes the grain(s) of the first metal and reduces pitting or grooving defects associated with the first metal during thermal processes. The second metal may be introduced into the first metal by a deposition process or an ion implantation process, followed by an annealing process. Embodiments of the present disclosure can be readily integrated into existing or future mid end of the line (MOEL) process or back end of the line (BEOL) process and are particularly useful for creating plugs 10 nm or smaller.

In one aspect, the present disclosure is directed to a method that comprises receiving a structure having a dielectric layer over a conductive feature; etching a hole through the dielectric layer and exposing the conductive feature; depositing a first metal into the hole and in direct contact with the dielectric layer and the conductive feature; depositing a second metal over the first metal; and annealing the structure including the first and the second metals.

In an embodiment, the method further comprises performing a chemical mechanical planarization process to remove at least a portion of the second metal. In some embodiments, the first metal includes ruthenium and the second metal includes cobalt, nickel, or rhodium. In some further embodiments, the dielectric layer includes silicon dioxide and the conductive feature includes copper, cobalt, tungsten, ruthenium, rhodium, iridium, molybdenum, a silicide, or a metal nitride.

In an embodiment, the first metal includes one of ruthenium, rhodium, iridium, molybdenum, and tungsten; and the second metal includes cobalt or nickel. In an embodiment, the first metal has a higher melting point than the second metal. In an embodiment, the annealing is performed at a temperature in a range from one eighth to one half of a melting point of the second metal.

In an embodiment, the second metal includes cobalt, nickel, or rhodium and the annealing is performed at a temperature in a range from 300° C. to 500° C. In an embodiment, the annealing is performed with a carrier gas having a noble gas, nitrogen gas ($N_2$), hydrogen gas ($H_2$), nitrogen-hydrogen gas ($N_2H_2$), or ammonia ($NH_3$). In an embodiment, the depositing of the second metal includes a chemical vapor deposition process, a physical vapor deposition process, or a plating process.

In another aspect, the present disclosure is directed to a method that includes receiving a structure having a dielectric layer over a conductive feature; etching a hole through the dielectric layer and exposing the conductive feature; depositing a first metal into the hole and in direct contact with the dielectric layer and the conductive feature; implanting ions of a second metal into the first metal; and annealing the structure including the first and the second metals.

In an embodiment, the first metal includes ruthenium and the second metal includes one of cobalt, nickel, rhodium, iridium, molybdenum, and tungsten. In an embodiment, the implanting is performed with a tilt angle in a range of 0 to 30 degrees. In a further embodiment, the implanting is performed with an energy in a range of 2 keV to 15 keV. In an embodiment, the method further includes performing a chemical mechanical planarization process to remove a portion of the first metal.

In yet another aspect, the present disclosure is directed to a semiconductor structure that comprises a conductive feature; a dielectric layer over the conductive feature; and a plug over the conductive feature and at least partially surrounded by the dielectric layer. The plug includes a first metal and a second metal different from the first metal, wherein the second metal is distributed along an interface between the first metal and the dielectric layer.

In an embodiment, the second metal is also distributed along another interface between the first metal and the conductive feature. In an embodiment, the plug includes multiple grains of the first metal, and the second metal is also distributed along one or more boundaries of the multiple grains. In an embodiment, the first metal includes ruthenium, rhodium, iridium, molybdenum, or tungsten; and the second metal includes cobalt, nickel, or rhodium. In an embodiment, the first metal includes ruthenium and the second metal includes cobalt, nickel, rhodium, iridium, molybdenum, and tungsten.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   receiving a structure having a dielectric layer over a conductive feature, wherein the conductive feature includes a first metal;
   etching a hole through the dielectric layer and exposing the conductive feature;
   depositing a second metal into the hole and in direct contact with the dielectric layer and the conductive feature, the second metal entirely filling the hole;
   annealing the structure such that atoms of the first metal diffuse into grain boundaries of the second metal and into interfaces between the second metal and the dielectric layer; and
   after the annealing, performing a chemical mechanical planarization (CMP) process to remove at least a portion of the second metal.

2. The method of claim 1, wherein the first metal has a lower melting point than the second metal.

3. The method of claim 2, wherein the second metal includes ruthenium, iridium, molybdenum, or tungsten; and the second metal includes cobalt, nickel, or rhodium.

4. The method of claim 2, wherein the annealing is performed at a temperature in a range from one eighth to one half of a melting point of the first metal.

5. The method of claim 2, wherein the first metal includes cobalt, nickel, or rhodium and the annealing is performed at a temperature in a range from 300° C. to 500° C.

6. The method of claim 2, wherein the dielectric layer includes silicon dioxide and the second metal includes ruthenium, iridium, molybdenum, or tungsten.

7. The method of claim 1, wherein the second metal includes multiple grains vertically stacked after the CMP process.

8. The method of claim 1, wherein the second metal further includes multiple grains horizontally arranged after the CMP process.

9. A method, comprising:
   receiving a structure having an etch stop layer (ESL) and a dielectric layer over a conductive feature comprising a first metal;
   etching a hole through the dielectric layer and the ESL to expose the conductive feature;
   depositing a second metal over the hole, the exposed conductive feature and a top surface of the dielectric layer;
   after the depositing of the second metal, annealing the structure such that atoms of the first metal diffuse into grain boundaries of the second metal and into interfaces between the second metal and the dielectric layer; and
   after the annealing, planarizing the structure to expose the top surface of the dielectric layer,
   wherein a melting point of the first metal is lower than a melting point of the second metal.

10. The method of claim 9, wherein the ESL comprises silicon nitride, alumina, silicon carbide, or silicon oxycarbide.

11. The method of claim 9, wherein a width of the hole along a horizontal direction is smaller than 10 nm.

12. The method of claim 9,
    wherein the first metal comprises cobalt, nickel, rhodium, iridium, molybdenum, or tungsten,
    wherein the second metal comprises ruthenium.

13. The method of claim 9, wherein, after the annealing, a content of the first metal in the grain boundaries of the second metal is between about 10% and about 90%.

14. The method of claim 9, wherein, after the annealing, a content of the first metal at the interfaces of the second metal and the dielectric layer is between about 10% and about 90%.

15. A method, comprising:
    receiving a structure having an etch stop layer (ESL) and a dielectric layer over a source/drain contact formed of a first metal;
    etching a via hole through the dielectric layer and the ESL to expose the source/drain contact;

depositing a second metal over the via hole to interface the exposed source/drain contact, the ESL, the dielectric layer, and a top surface of the dielectric layer;

after the depositing of the second metal, annealing the structure such that atoms of the first metal diffuse into grain boundaries of the second metal and into interfaces between the second metal and the dielectric layer; and after the annealing, planarizing the structure to expose the top surface of the dielectric layer, wherein a melting point of the first metal is different from a melting point of the second metal.

16. The method of claim 15, wherein the first metal includes ruthenium, rhodium, iridium, molybdenum, or tungsten, wherein the second metal includes cobalt, nickel, or rhodium.

17. The method of claim 15, wherein the via hole extends into the source/drain contact.

18. The method of claim 15, further comprising:

before the depositing of the first metal, performing a post-etch cleaning process to clean the via hole.

19. The method of claim 18, wherein the post-etch cleaning process comprises a wet etch process.

20. The method of claim 15, wherein the annealing is performed at a temperature between 300° C. and 500° C.

* * * * *